(12) United States Patent
Asnes

(10) Patent No.: US 12,160,711 B2
(45) Date of Patent: *Dec. 3, 2024

(54) INTEGRATED SHOCK AND IMPACT MANAGEMENT OF A TRANSDUCER

(71) Applicant: Cochlear Limited, Macquarie University (AU)

(72) Inventor: Kristian Gunnar Asnes, Macquarie University (AU)

(73) Assignee: Cochlear Limited, Macquarie University (AU)

( * ) Notice: Subject to any disclaimer, the term of this patent is extended or adjusted under 35 U.S.C. 154(b) by 354 days.

This patent is subject to a terminal disclaimer.

(21) Appl. No.: 17/268,552

(22) PCT Filed: Sep. 11, 2019

(86) PCT No.: PCT/IB2019/057630
§ 371 (c)(1),
(2) Date: Feb. 15, 2021

(87) PCT Pub. No.: WO2020/053768
PCT Pub. Date: Mar. 19, 2020

(65) Prior Publication Data
US 2021/0321206 A1    Oct. 14, 2021

Related U.S. Application Data

(60) Provisional application No. 62/729,940, filed on Sep. 11, 2018.

(51) Int. Cl.
*H04R 1/10*    (2006.01)
*G01V 1/52*    (2006.01)
(Continued)

(52) U.S. Cl.
CPC .......... *H04R 25/606* (2013.01); *G01V 1/523* (2013.01); *H04R 1/2876* (2013.01);
(Continued)

(58) Field of Classification Search
CPC .... H04R 25/606; H04R 17/005; H04R 23/02; H04R 2460/13; H04R 25/60; H04R 17/00;
(Continued)

(56) References Cited

U.S. PATENT DOCUMENTS 5,621,263 A * 4/1997 Kaida .................. H03H 9/0595
                                                              310/326
6,885,753 B2 * 4/2005 Bank ..................... H04R 7/045
                                                              381/151
(Continued)

FOREIGN PATENT DOCUMENTS

EP         2234413 A2    9/2010
JP       2018056806 A    4/2018

OTHER PUBLICATIONS

Extended European search report for European Patent Application No. 19 860 076.9, mailed Apr. 14, 2022.
(Continued)

*Primary Examiner* — Gerald Gauthier
(74) *Attorney, Agent, or Firm* — Pilloff Passino & Cosenza LLP; Martin J. Cosenza

(57) ABSTRACT

A component of a bone conduction device, including a housing and a piezoelectric bender located in the housing, wherein the component is configured to limit bending of the piezoelectric bender relative to that which would otherwise be the case in the absence of the limits via application of a stopping force at a centralized location of an assembly of which the bender is a part.

27 Claims, 35 Drawing Sheets

(51) Int. Cl.
  *H04R 1/28* (2006.01)
  *H04R 25/00* (2006.01)
  *H10N 30/20* (2023.01)
(52) U.S. Cl.
  CPC ....... *H10N 30/204* (2023.02); *H04R 2225/67* (2013.01); *H04R 2460/13* (2013.01)
(58) Field of Classification Search
  CPC ........ H04R 1/028; H04R 1/10; H04R 1/2876; H04R 1/2896; H04R 7/045; H04R 25/554; H04R 2225/67; H04R 1/1016; G01V 1/523; G06F 1/169; H10N 30/204; A61B 17/1626; A61N 1/37512; E04F 13/0894
  See application file for complete search history.

(56) References Cited

U.S. PATENT DOCUMENTS

| | | | | |
|---|---|---|---|---|
| 7,298,067 | B1* | 11/2007 | Kosinski | H03H 9/1014 |
| | | | | 310/341 |
| 8,837,760 | B2 | 9/2014 | Andersson et al. | |
| 10,602,284 | B2* | 3/2020 | Nilsson | H04R 25/606 |
| 2003/0048915 | A1* | 3/2003 | Bank | H04R 1/028 |
| | | | | 381/326 |
| 2003/0053642 | A1* | 3/2003 | Bank | H04R 1/028 |
| | | | | 381/86 |
| 2003/0053643 | A1* | 3/2003 | Bank | H04R 1/028 |
| | | | | 381/431 |
| 2003/0057294 | A1* | 3/2003 | Bank | H04R 1/028 |
| | | | | 239/102.2 |
| 2003/0059068 | A1* | 3/2003 | Bank | G06F 1/169 |
| | | | | 381/337 |
| 2003/0059069 | A1* | 3/2003 | Bank | H04R 7/045 |
| | | | | 381/431 |
| 2009/0245556 | A1* | 10/2009 | Parker | H04R 25/606 |
| | | | | 381/326 |
| 2009/0312835 | A1* | 12/2009 | Stevenson | A61N 1/37512 |
| | | | | 607/45 |
| 2010/0298626 | A1 | 11/2010 | Andersson et al. | |
| 2015/0156594 | A1 | 6/2015 | Bervoets | |
| 2015/0201918 | A1* | 7/2015 | Kumar | A61B 17/1626 |
| | | | | 606/104 |
| 2015/0308124 | A1* | 10/2015 | Newman | E04F 13/0894 |
| | | | | 52/747.11 |
| 2016/0037273 | A1 | 2/2016 | Gustafsson | |
| 2017/0134841 | A1* | 5/2017 | Miller | H04R 1/10 |
| 2017/0180897 | A1* | 6/2017 | Perianu | H04R 1/1016 |
| 2017/0318399 | A1* | 11/2017 | Meskens | H04R 25/554 |
| 2017/0340456 | A1* | 11/2017 | Behzadi | A61F 2/4657 |
| 2018/0020301 | A1* | 1/2018 | Gustafsson | H04R 25/606 |
| 2018/0035219 | A1* | 2/2018 | Gustafsson | H04R 25/606 |
| 2018/0124530 | A1* | 5/2018 | Bergs | H04R 25/606 |
| 2018/0279061 | A1* | 9/2018 | Walraevens | H04R 25/606 |
| 2019/0028819 | A1* | 1/2019 | Vermeiren | H04R 25/606 |
| 2019/0247650 | A1* | 8/2019 | Tran | A61N 1/3704 |
| 2019/0340906 | A1* | 11/2019 | Williams | G08B 21/0277 |
| 2020/0051189 | A1* | 2/2020 | Williams | H04L 67/535 |
| 2021/0084451 | A1* | 3/2021 | Williams | H04W 4/38 |
| 2021/0321206 | A1* | 10/2021 | Asnes | H04R 1/2896 |
| 2022/0021991 | A1* | 1/2022 | Gustafsson | H04R 25/606 |

OTHER PUBLICATIONS

International Search Report & Written Opinion for PCT/IB2019/057630, mailed Jan. 2, 2020.

* cited by examiner

INTEGRATED SHOCK AND IMPACT MANAGEMENT OF A TRANSDUCER

CROSS-REFERENCE TO RELATED APPLICATIONS

This application claims priority to U.S. Provisional Application No. 62/729,940, entitled INTEGRATED SHOCK AND IMPACT MANAGEMENT OF A TRANSDUCER, filed on Sep. 11, 2018, naming Kristian Gunnar ASNES of Mölnlycke, Sweden as an inventor, the entire contents of that application being incorporated herein by reference in its entirety.

BACKGROUND

Hearing loss, which may be due to many different causes, is generally of two types: conductive and sensorineural. Sensorineural hearing loss is due to the absence or destruction of the hair cells in the cochlea that transduce sound signals into nerve impulses. Various hearing prostheses are commercially available to provide individuals suffering from sensorineural hearing loss with the ability to perceive sound. For example, cochlear implants use an electrode array implanted in the cochlea of a recipient to bypass the mechanisms of the ear. More specifically, an electrical stimulus is provided via the electrode array to the auditory nerve, thereby causing a hearing percept.

Conductive hearing loss occurs when the normal mechanical pathways that provide sound to hair cells in the cochlea are impeded, for example, by damage to the ossicular chain or the ear canal. Individuals suffering from conductive hearing loss may retain some form of residual hearing because the hair cells in the cochlea may remain undamaged.

Individuals suffering from conductive hearing loss typically receive an acoustic hearing aid. Hearing aids rely on principles of air conduction to transmit acoustic signals to the cochlea. In particular, a hearing aid typically uses an arrangement positioned in the recipient's ear canal or on the outer ear to amplify a sound received by the outer ear of the recipient. This amplified sound reaches the cochlea causing motion of the perilymph and stimulation of the auditory nerve.

In contrast to hearing aids, which rely primarily on the principles of air conduction, certain types of hearing prostheses, commonly referred to as bone conduction devices, convert a received sound into vibrations. The vibrations are transferred through the skull to the cochlea causing generation of nerve impulses, which result in the perception of the received sound. Bone conduction devices are suitable to treat a variety of types of hearing loss and may be suitable for individuals who cannot derive sufficient benefit from acoustic hearing aids, cochlear implants, etc., or for individuals who suffer from stuttering problems.

SUMMARY

In accordance with one embodiment, there is a component of a bone conduction device, comprising a housing; and a piezoelectric bender located in the housing, wherein the component is configured to limit bending of the piezoelectric bender relative to that which would otherwise be the case in the absence of the limits via application of a stopping force at a centralized location of an assembly of which the bender is a part.

In accordance with another embodiment, there is a component of a bone conduction device, comprising a housing and a piezo-seismic mass assembly, wherein the component is configured to enable permanent shock-proofing of the piezo transducer of the piezo-seismic mass assembly beyond that which results from damping while at least a portion of the piezo-seismic mass assembly is fixed relative to the housing.

In accordance with another embodiment, there is a component of a bone conduction device, comprising a housing; and a piezoelectric bender located in the housing, wherein bending of the piezoelectric bender is damped via at least one of gas damping or shear damping.

In accordance with another embodiment, there is a method, comprising obtaining a component of a bone conduction device including a transducer-seismic mass assembly located within a housing operating the transducer of the assembly such that the transducer bends upwards and/or downwards to produce vibrations that evoke a first hearing percept via bone conduction while preventing the transducer from fully flapping or limiting an amount of flap of the transducer relative to that which the transducer can flap without the limitation, wherein the seismic mass assembly is free of contact with the housing during normal operation other than via the transducer.

BRIEF DESCRIPTION OF THE DRAWINGS

Some embodiments are described below with reference to the attached drawings, in which.

DETAILED DESCRIPTION

Embodiments herein are described primarily in terms of a bone conduction device, such as an active transcutaneous bone conduction device and a passive transcutaneous bone conduction device, as well as percutaneous bone conduction devices. Thus, any disclosure herein of one corresponds to another disclosure of the other two unless otherwise noted. Any disclosure herein is a disclosure of the subject matter disclosed with any one of the three types of bone conduction devices just detailed, unless otherwise noted. Also, it is noted that the teachings detailed herein and/or variations thereof are also applicable to a middle ear implant or an inner ear implant that utilizes a mechanical actuator. Also, any disclosure herein corresponds to a disclosure of the utilization of the teachings herein in a prosthesis that is different than a hearing prosthesis, such as, for example, a bionic limb or appendage, a muscle stimulator, etc. Moreover, any disclosure herein corresponds to a disclosure of the utilization of the teachings herein in a non-prosthetic device (e.g., a device that simply has a piezoelectric transducer). Accordingly, any disclosure herein of teachings corresponds to a disclosure of use in a middle ear implant or an inner ear mechanical stimulator, or a general prosthesis, or a non-prosthetic device.

Figure 1:
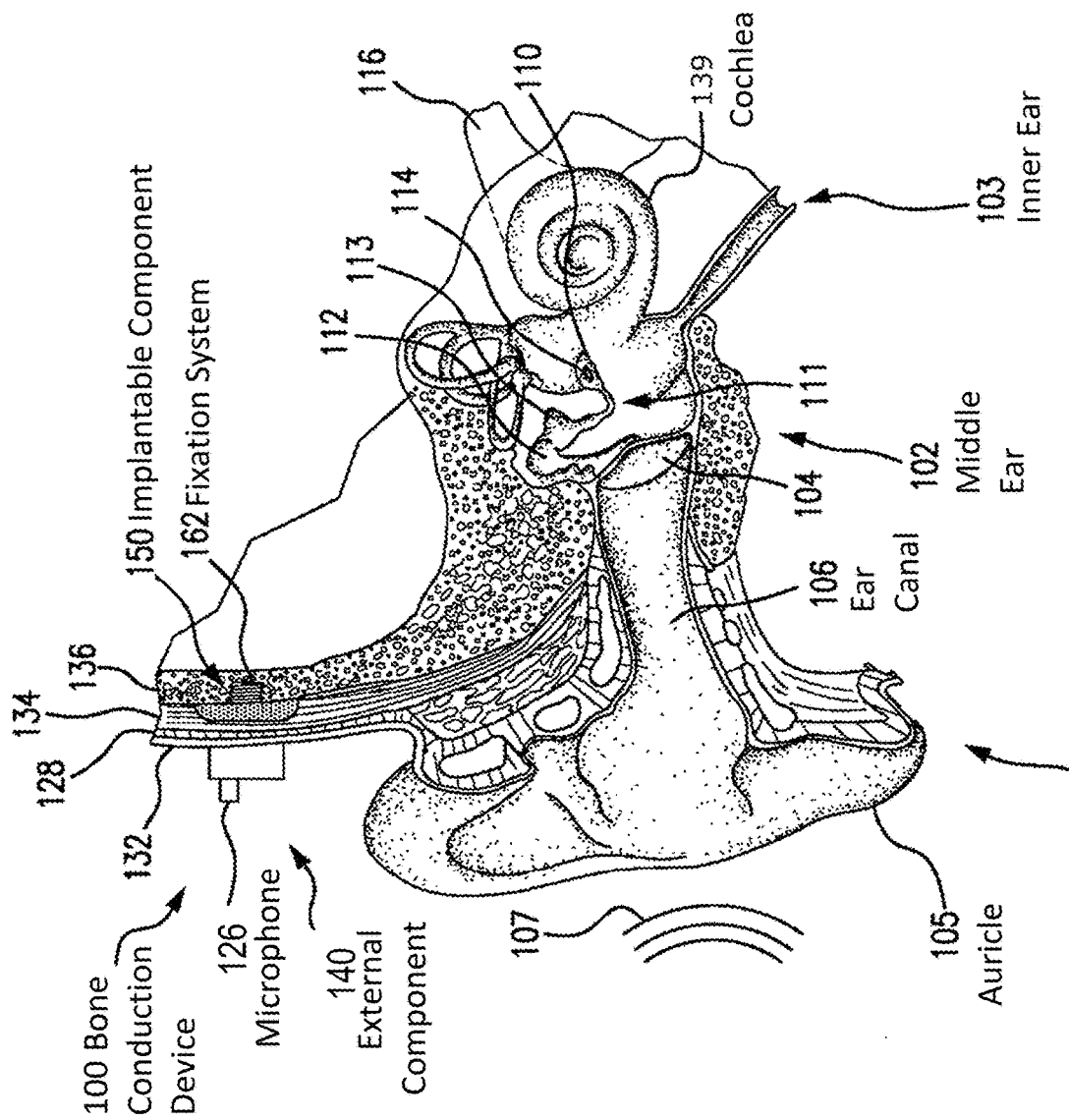
FIG. 1 is a perspective view of an exemplary bone conduction device in which at least some embodiments can be implemented.

FIG. 1 is a perspective view of a bone conduction device 100 in which embodiments may be implemented. As shown, the recipient has an outer ear 101, a middle ear 102, and an inner ear 103. Elements of outer ear 101, middle ear 102, and inner ear 103 are described below, followed by a description of bone conduction device 100.

In a fully functional human hearing anatomy, outer ear 101 comprises an auricle 105 and an ear canal 106. A sound wave or acoustic pressure 107 is collected by auricle 105 and channeled into and through ear canal 106. Disposed across the distal end of ear canal 106 is a tympanic membrane 104 which vibrates in response to acoustic wave 107. This vibration is coupled to oval window or fenestra ovalis 210 through three bones of middle ear 102, collectively referred to as the ossicles 111 and comprising the malleus 112, the incus 113 and the stapes 114. The ossicles 111 of middle ear 102 serve to filter and amplify acoustic wave 107, causing oval window 210 to vibrate. Such vibration sets up waves of fluid motion within cochlea 139. Such fluid motion, in turn, activates hair cells (not shown) that line the inside of cochlea 139. Activation of the hair cells causes appropriate nerve impulses to be transferred through the spiral ganglion cells and auditory nerve 116 to the brain (not shown), where they are perceived as sound.

FIG. 1 also illustrates the positioning of bone conduction device 100 relative to outer ear 101, middle ear 102, and inner ear 103 of a recipient of device 100. Bone conduction device 100 comprises an external component 140 and implantable component 150. As shown, bone conduction device 100 is positioned behind outer ear 101 of the recipient and comprises a sound input element 126 to receive sound signals. Sound input element 126 may comprise, for example, a microphone. In an exemplary embodiment, sound input element 126 may be located, for example, on or in bone conduction device 100, or on a cable extending from bone conduction device 100.

More particularly, sound input device 126 (e.g., a microphone) converts received sound signals into electrical signals. These electrical signals are processed by the sound processor. The sound processor generates control signals which cause the actuator to vibrate. In other words, the actuator converts the electrical signals into mechanical motion to impart vibrations to the recipient's skull.

Alternatively, sound input element 126 may be subcutaneously implanted in the recipient, or positioned in the recipient's ear. Sound input element 126 may also be a component that receives an electronic signal indicative of sound, such as, for example, from an external audio device. For example, sound input element 126 may receive a sound signal in the form of an electrical signal from an MP3 player electronically connected to sound input element 126.

Bone conduction device 100 comprises a sound processor (not shown), an actuator (also not shown), and/or various other operational components. In operation, the sound processor converts received sounds into electrical signals. These electrical signals are utilized by the sound processor to generate control signals that cause the actuator to vibrate. In other words, the actuator converts the electrical signals into mechanical vibrations for delivery to the recipient.

In accordance with some embodiments, a fixation system 162 may be used to secure implantable component 150 to skull 136. As described below, fixation system 162 may be a bone screw fixed to skull 136, and also attached to implantable component 150.

In one arrangement of FIG. 1, bone conduction device 100 can be a passive transcutaneous bone conduction device. That is, no active components, such as the actuator, are implanted beneath the recipient's skin 132. In such an arrangement, the active actuator is located in external component 140, and implantable component 150 includes a magnetic plate, as will be discussed in greater detail below. The magnetic plate of the implantable component 150 vibrates in response to vibration transmitted through the skin, mechanically and/or via a magnetic field, that is generated by an external magnetic plate.

In another arrangement of FIG. 1, bone conduction device 100 can be an active transcutaneous bone conduction device where at least one active component, such as the actuator, is implanted beneath the recipient's skin 132 and is thus part of the implantable component 150. As described below, in such an arrangement, external component 140 may comprise a sound processor and transmitter, while implantable component 150 may comprise a signal receiver and/or various other electronic circuits/devices.

Figure 2:
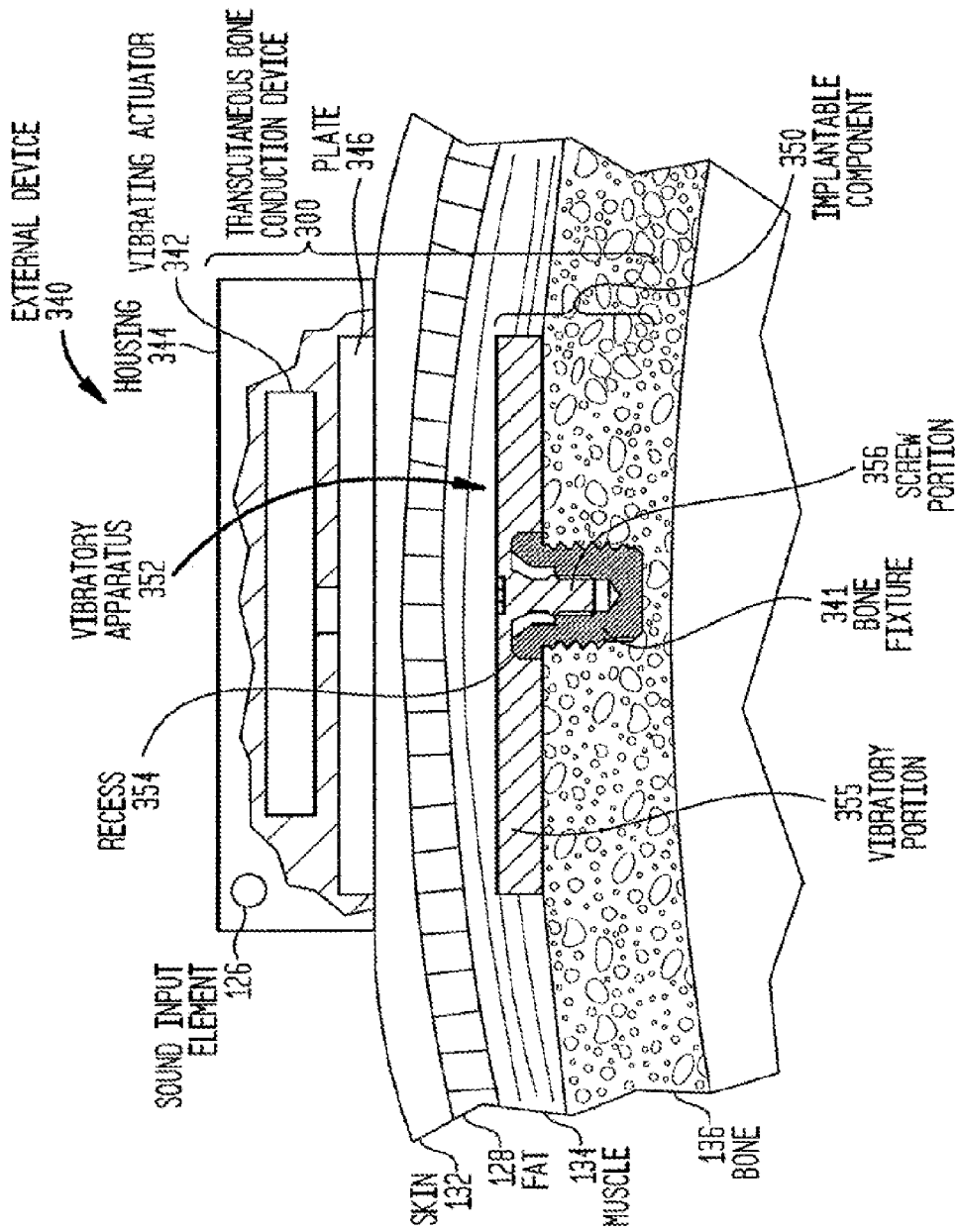
FIG. 2 is a schematic diagram conceptually illustrating a passive transcutaneous bone conduction device.

FIG. 2 depicts an exemplary transcutaneous bone conduction device 300 that includes an external device 340 (corresponding to, for example, element 140 of FIG. 1) and an implantable component 350 (corresponding to, for example, element 150 of FIG. 1). The transcutaneous bone conduction device 300 of FIG. 2 is a passive transcutaneous bone conduction device in that a vibrating actuator 342 (which can be an electromagnetic actuator or a piezoelectric actuator) is located in the external device 340. Vibrating actuator 342 is located in housing 344 of the external component and is coupled to plate 346. Plate 346 may be in the form of a permanent magnet and/or in another form that generates and/or is reactive to a magnetic field, or otherwise permits the establishment of magnetic attraction between the external device 340 and the implantable component 350 sufficient to hold the external device 340 against the skin of the recipient.

In an exemplary embodiment, the vibrating actuator 342 is a device that converts electrical signals into vibration. In operation, sound input element 126 converts sound into electrical signals. Specifically, the transcutaneous bone conduction device 300 provides these electrical signals to vibrating actuator 342, or to a sound processor (not shown) that processes the electrical signals, and then provides those processed signals to vibrating actuator 342. The vibrating actuator 342 converts the electrical signals (processed or unprocessed) into vibrations. Because vibrating actuator 342 is mechanically coupled to plate 346, the vibrations are transferred from the vibrating actuator 342 to plate 346. Implanted plate assembly 352 is part of the implantable component 350 and is made of a ferromagnetic material that may be in the form of a permanent magnet, that generates and/or is reactive to a magnetic field, or otherwise permits the establishment of a magnetic attraction between the external device 340 and the implantable component 350 sufficient to hold the external device 340 against the skin of the recipient. Accordingly, vibrations produced by the vibrating actuator 342 of the external device 340 are transferred from plate 346 across the skin to plate 355 of plate assembly 352. This can be accomplished as a result of mechanical conduction of the vibrations through the skin, resulting from the external device 340 being in direct contact with the skin and/or from the magnetic field between the two plates. These vibrations are transferred without penetrating the skin with a solid object, such as an abutment, with respect to a percutaneous bone conduction device.

As may be seen, the implanted plate assembly 352 is substantially rigidly attached to a bone fixture 341 in this embodiment. Plate screw 356 is used to secure plate assembly 352 to bone fixture 341. The portions of plate screw 356 that interface with the bone fixture 341 substantially correspond to an abutment screw discussed in some additional detail below, thus permitting plate screw 356 to readily fit into an existing bone fixture used in a percutaneous bone conduction device. In an exemplary embodiment, plate screw 356 is configured so that the same tools and procedures that are used to install and/or remove an abutment screw (described below) from bone fixture 341 can be used to install and/or remove plate screw 356 from the bone fixture 341 (and thus the plate assembly 352).

Figure 3:
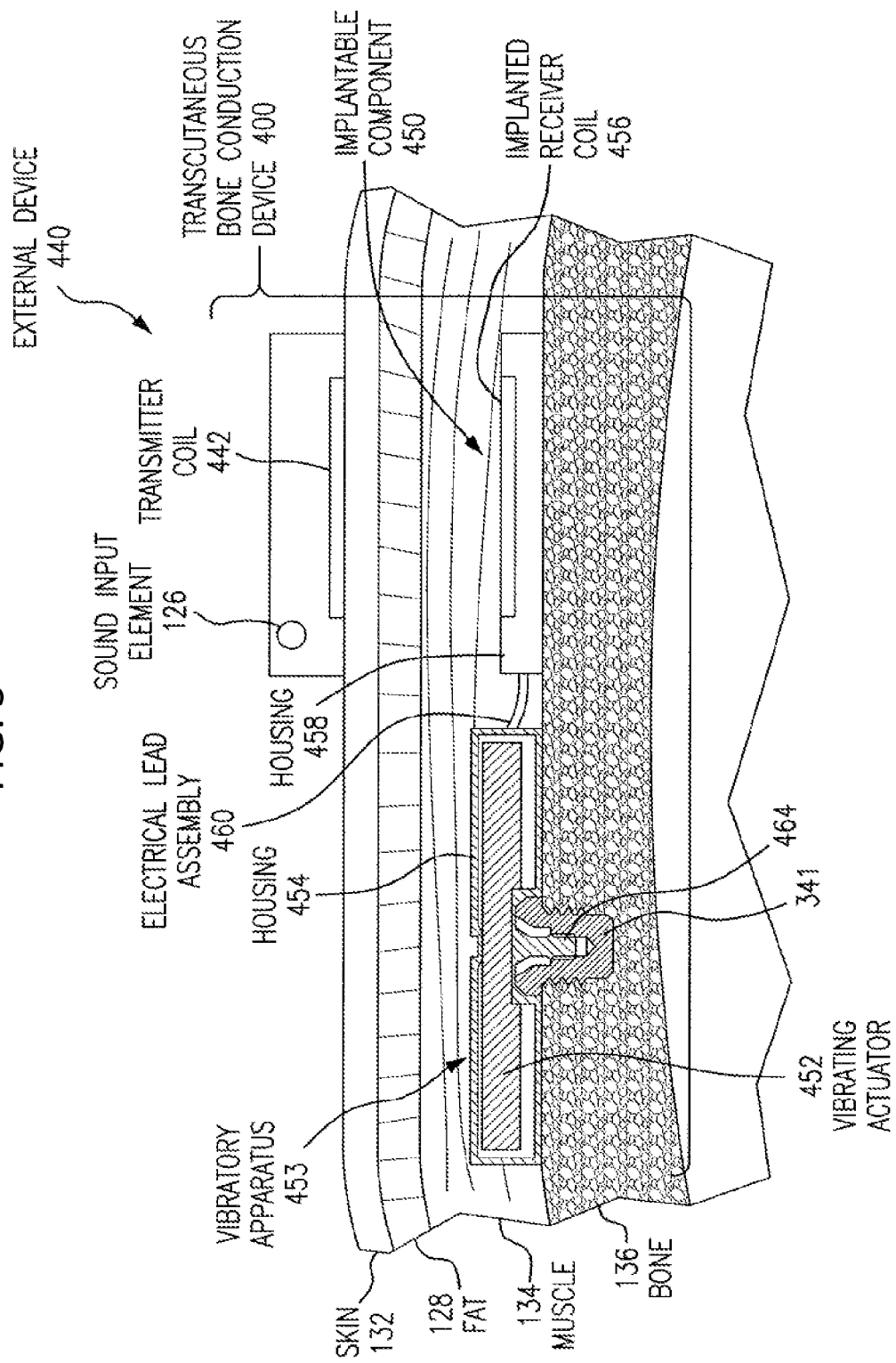
FIG. 3 is a schematic diagram conceptually illustrating an active transcutaneous bone conduction device in accordance with at least some exemplary embodiments.

FIG. 3 depicts an exemplary embodiment of a transcutaneous bone conduction device 400 according to another embodiment that includes an external device 440 (corresponding to, for example, element 140B of FIG. 1) and an implantable component 450 (corresponding to, for example, element 150 of FIG. 1). The transcutaneous bone conduction device 400 of FIG. 3 is an active transcutaneous bone conduction device in that the vibrating actuator 452 (which can be an electromagnetic actuator, or a piezoelectric actuator, etc.) is located in the implantable component 450. Specifically, a vibratory element in the form of vibrating actuator 452 is located in housing 454 of the implantable component 450. In an exemplary embodiment, much like the vibrating actuator 342 described above with respect to transcutaneous bone conduction device 300, the vibrating actuator 452 is a device that converts electrical signals into vibration.

External component 440 includes a sound input element 126 that converts sound into electrical signals. Specifically, the transcutaneous bone conduction device 400 provides these electrical signals to vibrating actuator 452, or to a sound processor (not shown) that processes the electrical signals, and then provides those processed signals to the implantable component 450 through the skin of the recipient via a magnetic inductance link. In this regard, a transmitter coil 442 of the external component 440 transmits these signals to implanted receiver coil 456 located in housing 458 of the implantable component 450. Components (not shown) in the housing 458, such as, for example, a signal generator or an implanted sound processor, then generate electrical signals to be delivered to vibrating actuator 452 via electrical lead assembly 460. The vibrating actuator 452 converts the electrical signals into vibrations.

The vibrating actuator 452 is mechanically coupled to the housing 454. Housing 454 and vibrating actuator 452 collectively form a vibratory apparatus 453. The housing 454 is substantially rigidly attached to bone fixture 341.

Figure 4:
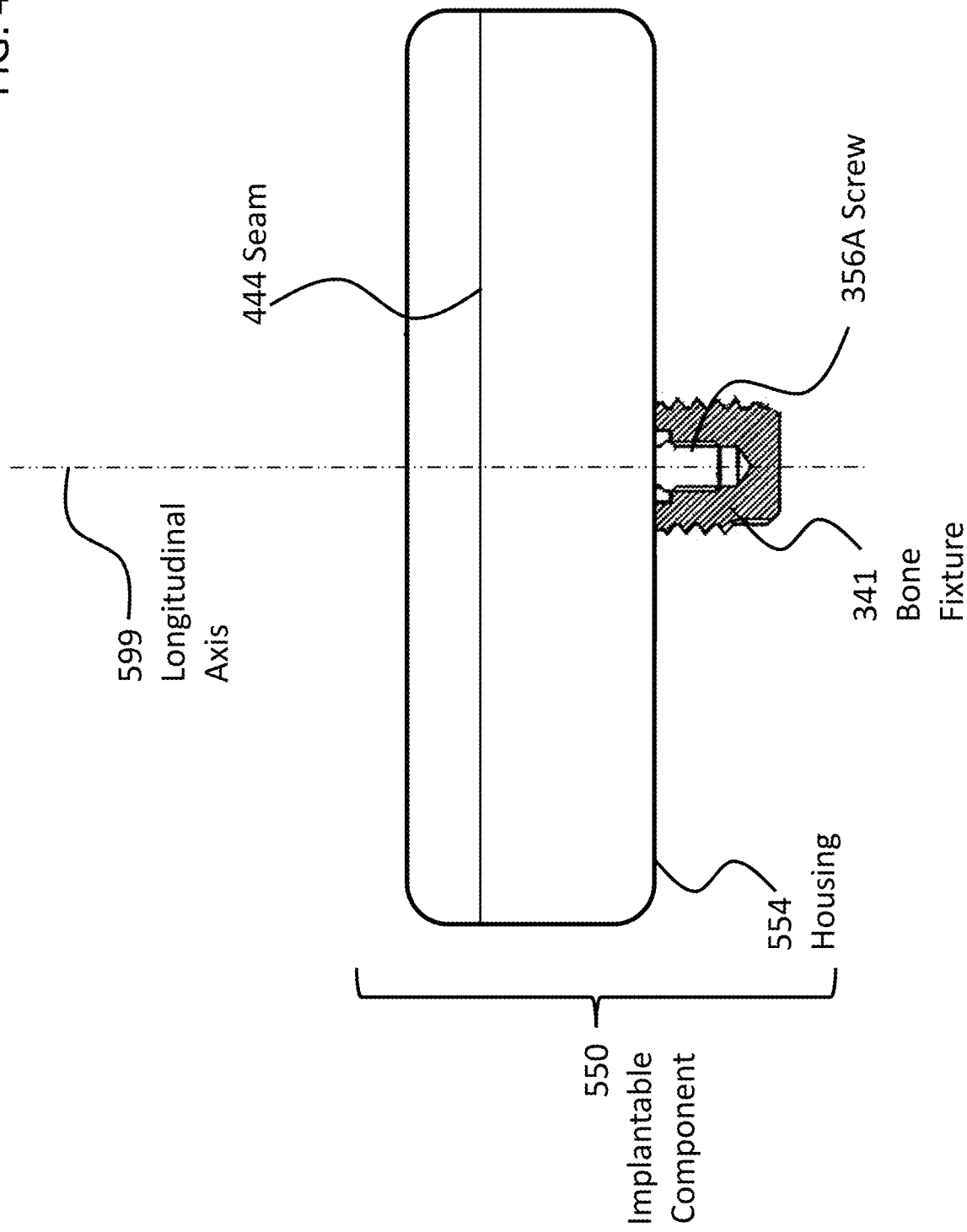
FIG. 4 is a schematic diagram of an outer portion of an implantable component of a bone conduction device.
Figure 5:
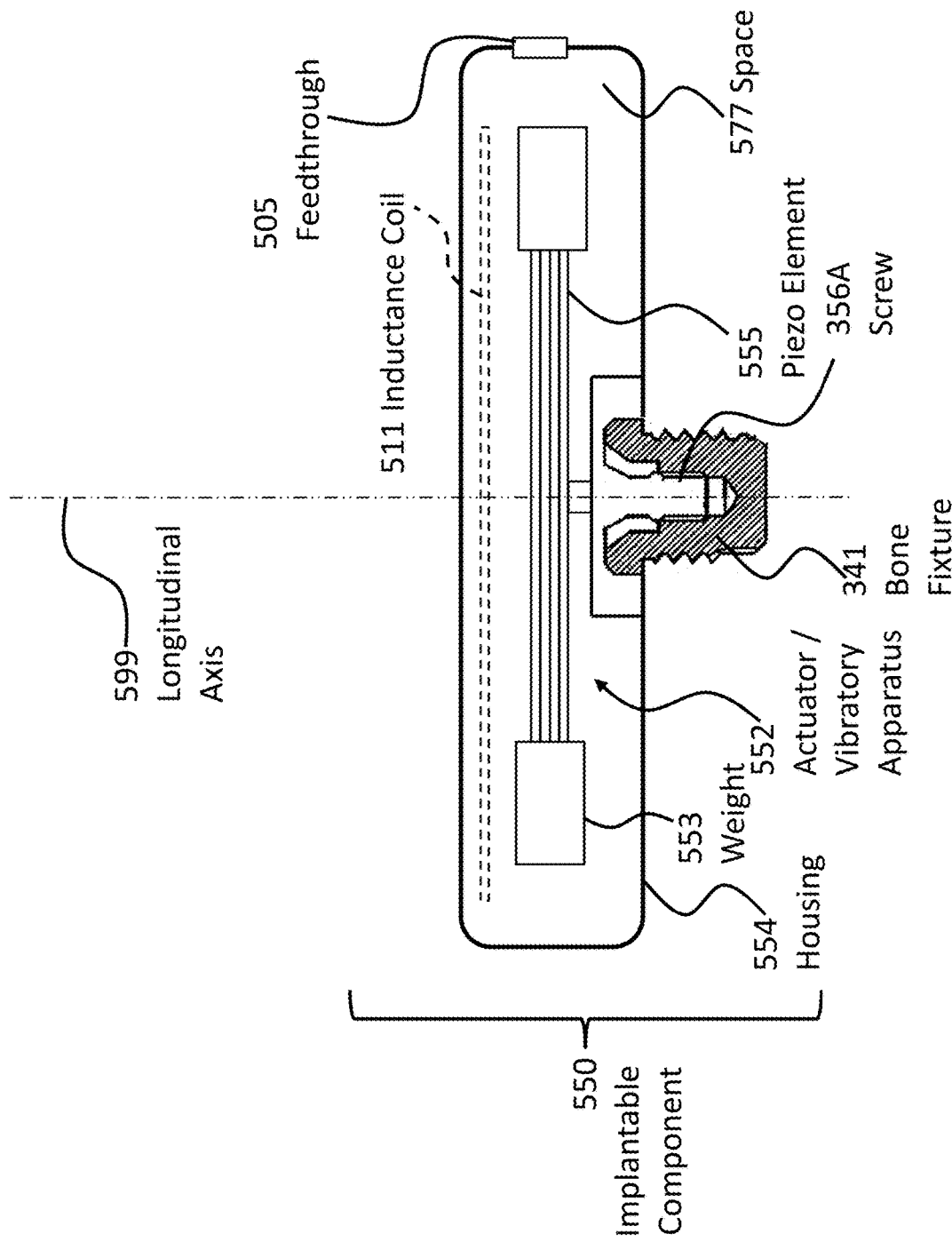
FIG. 5 is a schematic diagram of a cross-section of an exemplary implantable component of a bone conduction device.

FIGS. 4 and 5 depict another exemplary embodiment of an implantable component usable in an active transcutaneous bone conduction device, here, implantable component 550. FIG. 4 depicts a side view of the implantable component 550 which includes housing 554 which entails two housing bodies made of titanium in an exemplary embodiment, welded together at seam 444 to form a hermetically sealed housing. FIG. 5 depicts a cross-sectional view of the implantable component 550.

In an exemplary embodiment, the implantable component 550 is used in the embodiment of FIG. 3 in place of implantable component 450. As can be seen, implantable component 550 combines an actuator (corresponding with respect to functionality to actuator 452 detailed above) and, optionally, an inductance coil 511 (corresponding to coil 456 detailed above). Elements 555 plus 553 combine to establish a transducer-seismic mass assembly, sometimes herein referred to as an actuator and/or a vibratory apparatus, etc. Briefly, it is noted that the vibrating actuator 552 includes a so-called counterweight/mass 553 that is supported by piezoelectric components 555. In the exemplary embodiment of FIG. 5, the piezoelectric components 555 flex upon the exposure of an electrical current thereto, thus moving the counterweight 553. In an exemplary embodiment, this movement creates vibrations that are ultimately transferred to the recipient to evoke a hearing percept. Note that in some other embodiments, consistent with the embodiment of FIG. 4, the coil is located outside of the housing 553, and is in communication therewith via a feedthrough or the like. Any disclosure herein associated with one corresponds to a disclosure associated with the other, unless otherwise noted.

As can be understood from the schematic of FIG. 5, in an exemplary embodiment, the housing 554 entirely and completely encompasses the vibratory apparatus 552, but includes feedthrough 505, so as to permit the electrical lead assembly 460 to communicate with the vibrating actuator 452 therein. It is briefly noted at this time that some and/or all of the components of the embodiment of FIG. 5 are at least generally rotationally symmetric about the longitudinal axis 559. In this regard, the screw 356A is circular about the longitudinal axis 559. Back lines have been omitted for purposes of clarity in some instances.

Figure 6:
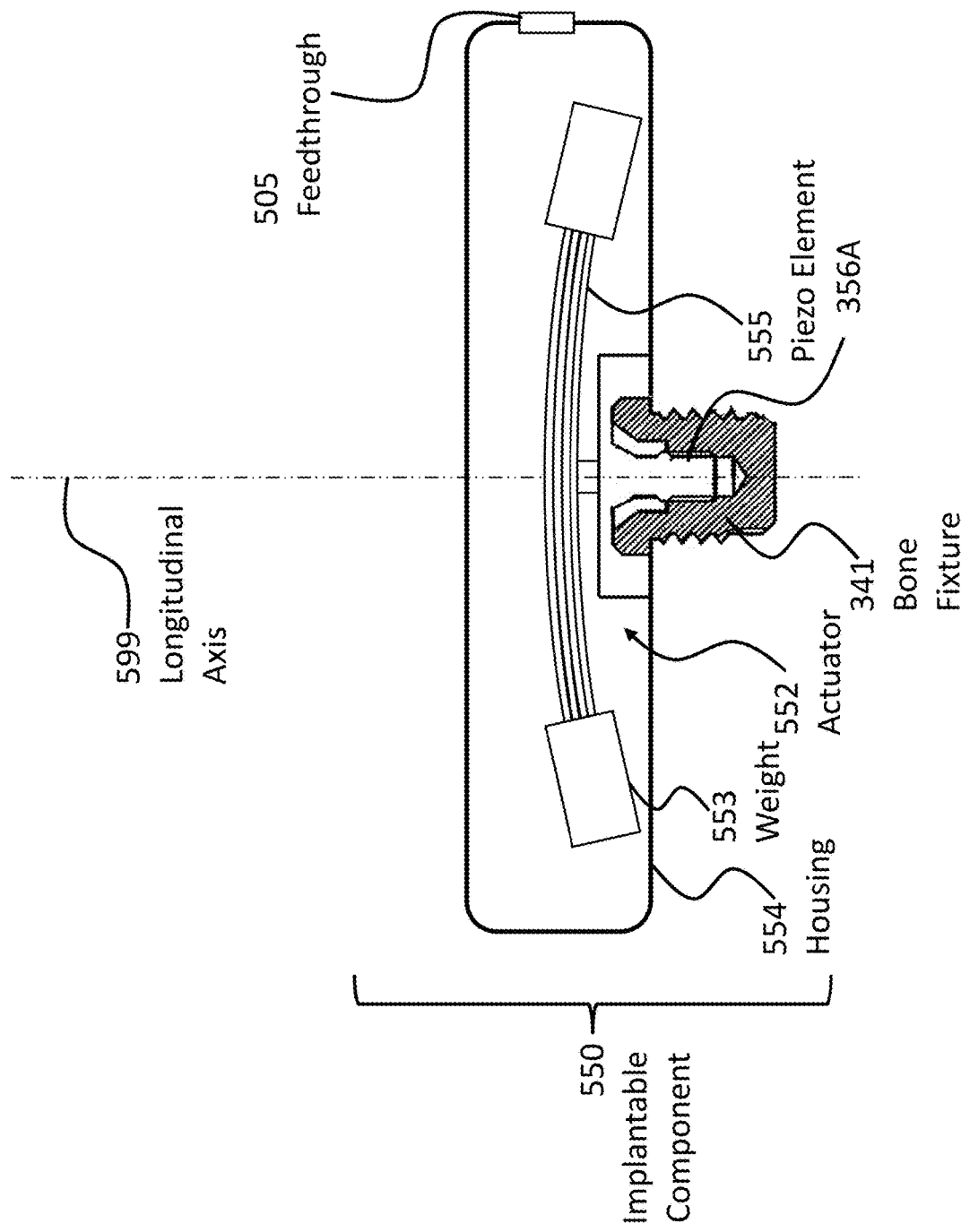
FIG. 6 is a schematic diagram of a cross-section of the exemplary implantable component of FIG. 5 in operation.

Still with reference to FIG. 5, as can be seen, there is a space 577 located between the housing 554 in general, and the inside wall thereof in particular, and the counterweight 553. This space has utilitarian value with respect to enabling the implantable component 550 to function as a transducer in that, in a scenario where the implantable component is an actuator, the piezoelectric material 555 can flex, which can enable the counterweight 553 to move within the housing 554 so as to generate vibrations to evoke a hearing percept. FIG. 6 depicts an exemplary scenario of movement of the piezoelectric material 555 when subjected to an electrical current along with the movement of the counterweight 553. As can be seen, space 577 provides for the movement of the actuator 552 within housing 554 so that the counterweight 553 does not come into contact with the inside wall of the housing 554. However, the inventors of the present application have identified a failure mode associated with such an implantable component 550. Specifically, in a scenario where prior to the attachment of the housing 554 and the components therein to the bone fixture 341, the housing and the components therein are subjected to an acceleration above certain amounts and/or a deceleration above certain amounts, the piezoelectric material 555 will be bent or otherwise deformed beyond its operational limits, which can, in some instances, have a deleterious effect on the piezoelectric material.

Figure 7:
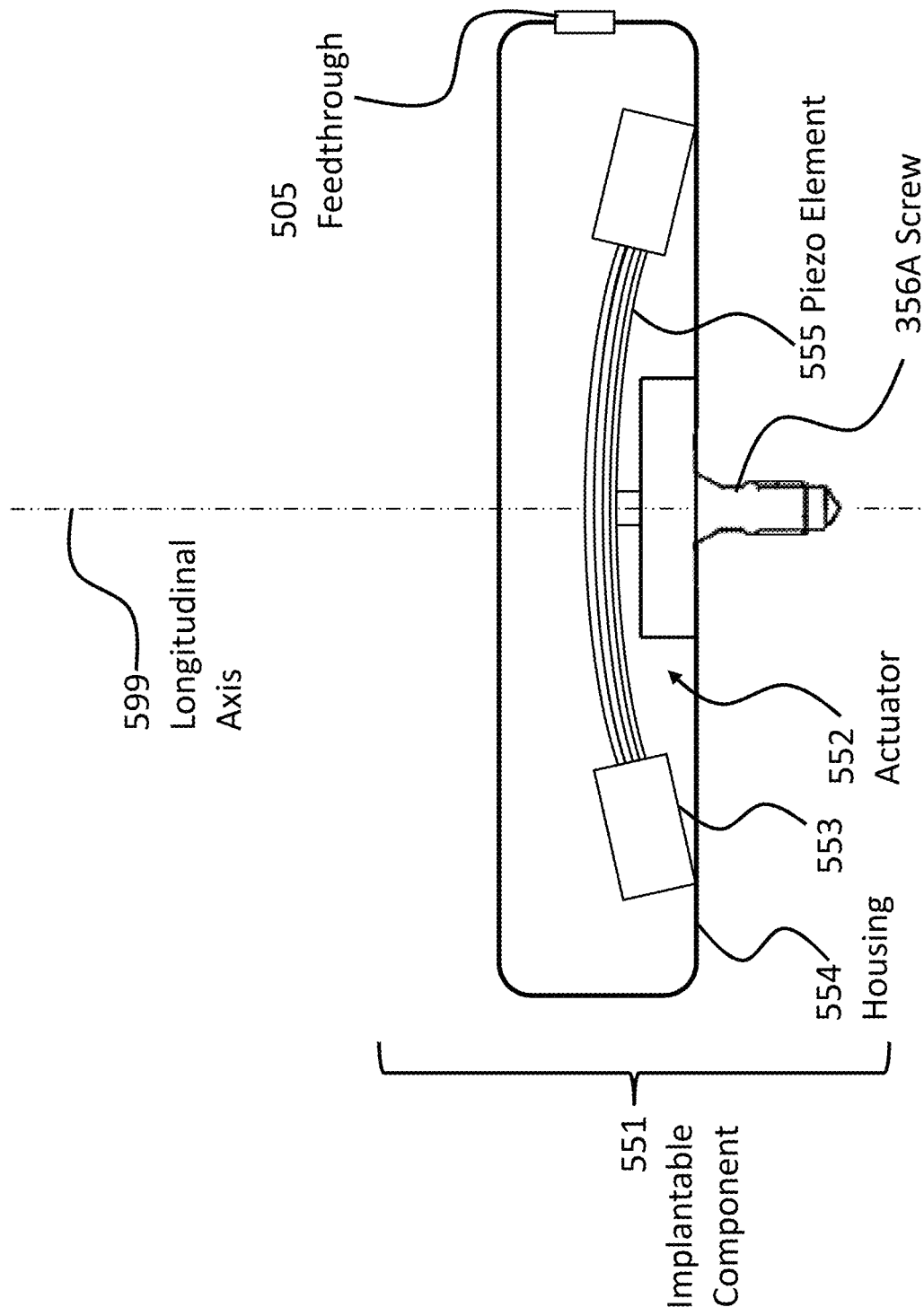
FIG. 7 is a schematic diagram of a cross-section of the exemplary implantable component of FIG. 5 in a failure mode.

FIG. 7 depicts an exemplary failure mode, where implantable subcomponent 551 (without bone fixture 541) prior to implantation into a recipient (and thus prior to attachment to the bone fixture 541) is dropped from a height of, for example, 30 cm, or from 1.2 meters, etc., onto a standard operating room floor or the like. The resulting deceleration causes the piezoelectric material 555, which is connected to the counterweight 553, to deform as seen in FIG. 7. This can break or otherwise plastically deform the piezoelectric material 555 (irrespective of whether the counterweight 553 contacts the housing walls, in some embodiments—indeed, in many embodiments, the piezoelectric material 555 will fail prior to the counterweights contacting the walls—thus, FIG. 7 is presented for purposes of conceptual illustration). The teachings detailed herein are directed towards avoiding such a scenario when associated with such decelerations and/or accelerations.

It is noted that while much of the disclosure herein is directed to a piezoelectric transducer, the teachings herein can also be applicable to an electromagnetic transducer. Thus, any disclosure associated with one corresponds to a disclosure of such for the other, and vis-versa.

Figure 8:
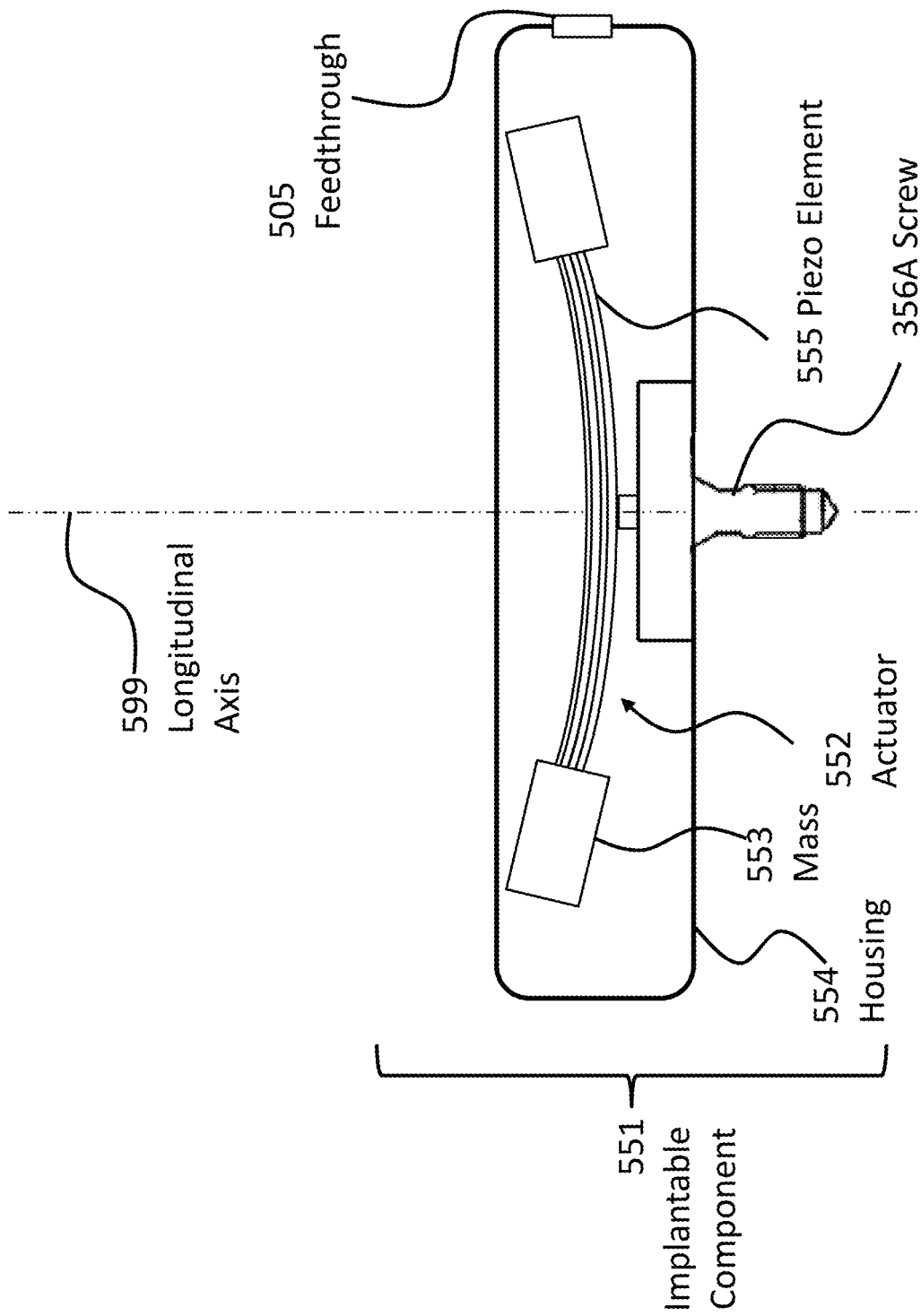
FIG. 8 is another schematic diagram of a cross-section of the exemplary implantable component of FIG. 5 in a failure mode.

Still further, it is noted that in at least some exemplary embodiments of a transcutaneous bone conduction device utilizing a piezoelectric actuator, it may not necessarily be the case that FIG. 7 represents a scenario that results in, all the time, a failure mode. That is, in some embodiments, the scenario depicted in FIG. 7 does not result in a failure mode for all types of piezoelectric actuators. In at least some exemplary embodiments, it is the "bounce back" from the initial deflection and the momentum that carries the piezoelectric material past the at rest position in the other direction that causes a failure mode. That is, by way of example only and not by way of limitation, there can be, in some scenarios, a reaction such that after the piezoelectric material 555 is deformed as depicted in FIG. 7 (or, in some instances, approximately thereabouts, or, in some instances, more than that which usually results from activation of the transducer in even extreme operational scenarios), the piezoelectric material deforms oppositely towards its at rest position, but owing to the fact that it was deformed a substantial amount as depicted in FIG. 7 (or as just described), as the piezo material springs/bounces back to the "at rest" position, the counterweights 553 have momentum which causes the piezoelectric material to deform in the opposite direction, as depicted by way of example in FIG. 8. In fact, in some instances, even though the counterweights 553 specifically, or the piezoelectric actuator in general, do not contact the inside of the housing 554, as was the case in FIG. 7, this "flapping" can cause the piezoelectric material 555 to break or otherwise permanently deform in a manner that does not have utilitarian value. To be clear, this phenomenon can also be the case with respect to the scenario FIG. 7, except where the counterweight 553 did not contact the inside the housing 554. That is, in at least some exemplary embodiments, the flapping can cause permanent damage to the piezoelectric material 555 irrespective of whether or not the counterweights 553 or other components of the piezoelectric actuator contact the housing. In at least some exemplary embodiments of the teachings detailed herein and/or variations thereof, this permanent damage is prevented from occurring, or otherwise the likelihood of such permanent damage is reduced, some exemplary embodiments of achieving such prevention and/or reduction will now be described.

Figure 9:
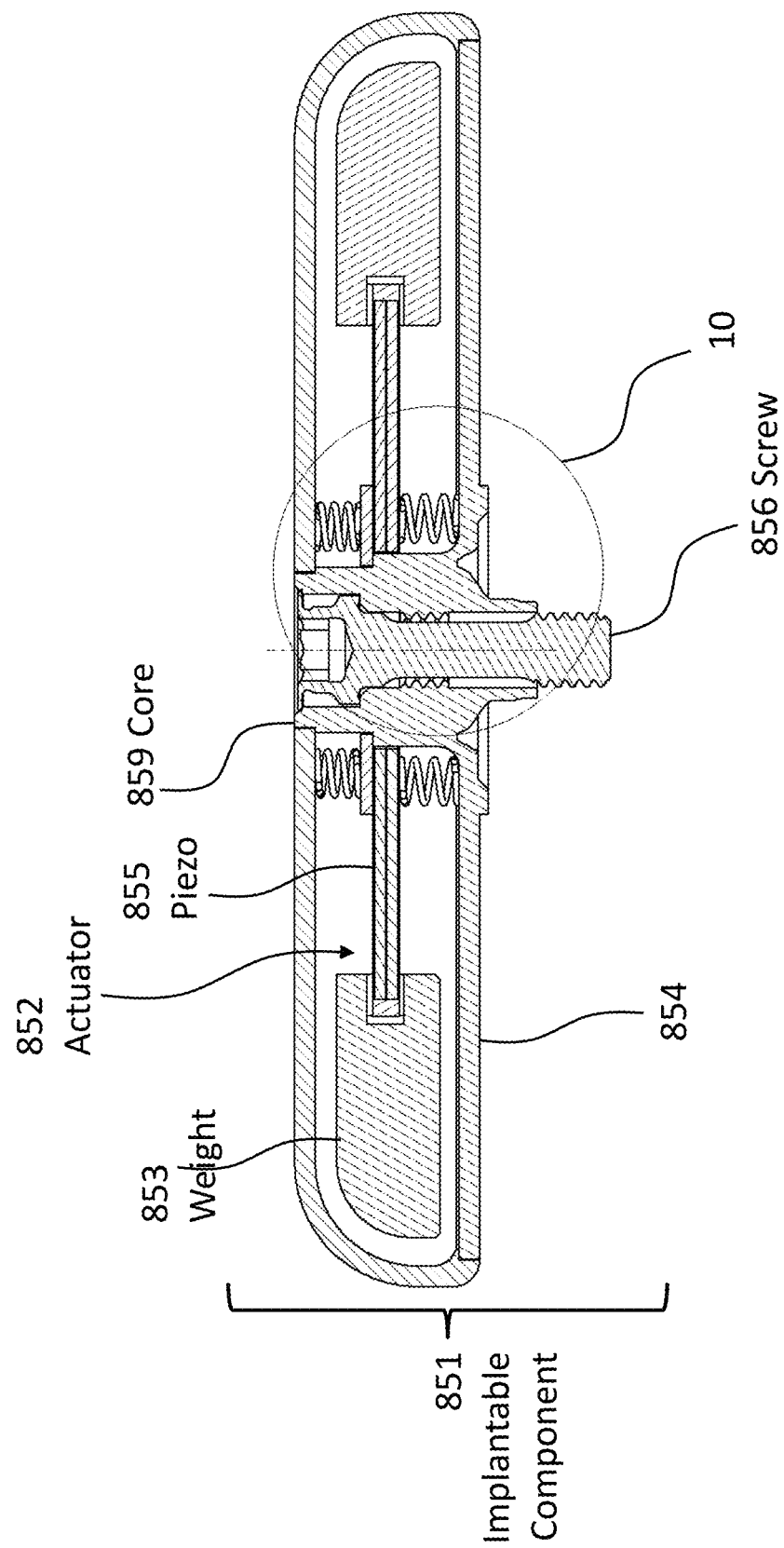
FIGS. 9 and 10 present an exemplary shock-proofing apparatus.

FIG. 9 depicts a cross-section through the geometric center of subcomponent 851. Implantable subcomponent 851 includes a housing 854 that encases an actuator 852, which actuator includes a piezoelectric material 855 corresponding to material 555 of FIG. 7, and a counterweight 853 that corresponds to the counterweight 553 of FIG. 7. Also seen in FIG. 9 is that the housing 854 includes a core 859. In this exemplary embodiment, the core 859 is an integral part with the bottom of the housing. The core 859 has a passage through which screw 856 extends, which screw is configured to screw into the bone fixture implanted into the bone of the recipient so as to fix the implantable subcomponent 851 to bone of the recipient. In this exemplary embodiment, the core 859 is such that the screw 856 can extend therethrough while maintaining a hermetically sealed environment within the housing (e.g., the housing subcomponent that forms the top of the housing 854 can be laser welded at the seams with the housing subcomponent that forms the bottom of the housing 854 and the core 859).

Figure 10:
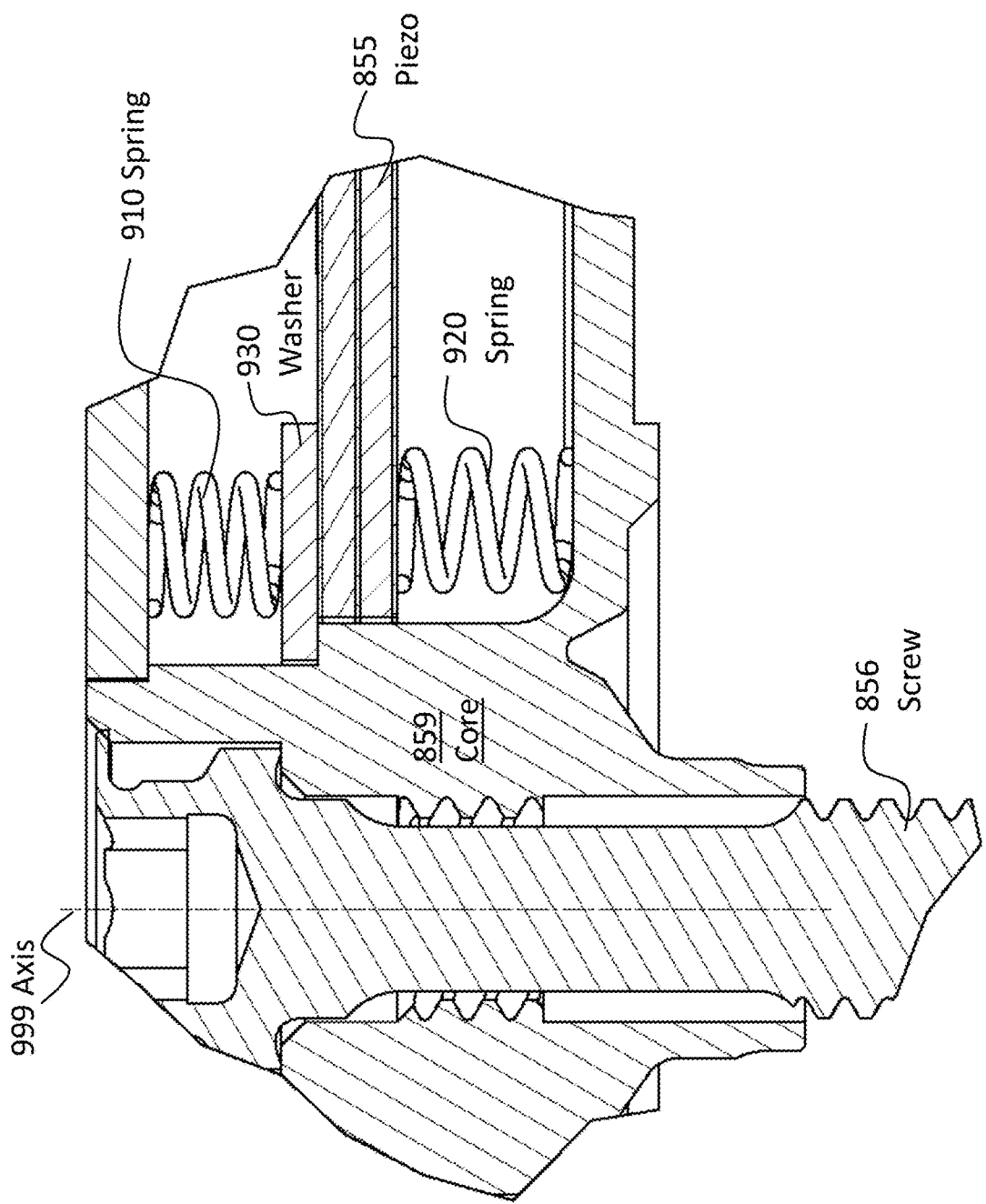

FIG. 10 depicts a larger view of a portion of the embodiment of FIG. 9. As can be seen, the piezoelectric material 855 is coated with a coating, thereby establishing the piezoelectric component. In some alternate embodiments, the piezoelectric material has no coating. Hereinafter, any use of the phrase piezoelectric material corresponds to a disclosure of piezoelectric material with coating, and thus a disclosure of a piezoelectric component, as well as a disclosure of a piezoelectric material without a coating (which still can be a piezoelectric component—there is just no coating), unless otherwise specified. The piezoelectric component 855 is clamped between two springs 910 and 920. A washer 930 is interposed between the top spring 910 and the piezoelectric material 855. Thus, the clamping of the piezoelectric component is in part, indirect by the springs. Where there is a washer at the bottom, as is the case in some embodiments, the clamping would be totally indirect by the springs, whereas in some exemplary embodiments, where there is no washer 930, and the springs directly contact the piezoelectric component, the clamping is totally direct.

In an exemplary embodiment, the springs 910 and 920 provide shock-proofing to the implantable subcomponent 851. The springs permit the entire piezoelectric component 855 to move upwards and/or downwards when subjected to a high acceleration and/or a high deceleration. This is as opposed to the scenario where only a portion of the piezoelectric component moves when exposed to these high accelerations, as is the case in some of the other embodiments herein. In this regard, the combination of the piezoelectric component and the counterweight creates a transducer-seismic mass assembly. In an exemplary embodiment, the springs permit the entire transducer-seismic mass assembly to move upwards and/or downwards when subjected to a high acceleration and/or a high deceleration. Again, this is as opposed to a scenario where only a portion of that transducer-seismic mass assembly moves, as is the case with respect to some other embodiments.

It is noted that the embodiment of FIG. 9 provides, via springs 910 and 920 and the associated components, a centralized support for the bender that results in a mounting force. In an exemplary embodiment, the mounting force provides a function of mounting the piezoelectric bender in the housing that is analogous to the arrangement that results if the bender is hard mounted/rigidly fixed to the core 859 vis-à-vis positioning the transducer-seismic mass assembly in the housing. Thus, the arrangement seen in FIG. 9 provides a variable mounting force. The limitations on the bending of the piezoelectric material from the stopping force occur at outboard locations.

Exemplary embodiments include impulse force damper(s) disposed between a component of the transducer (or, in some embodiments, the transducer-seismic mass assembly—more on this below). Impulse force damper assemblies, in at least some exemplary embodiments, fills the space/gap between the mass and the housing, while in other embodiments, are present in the gap but do not fill the space. In some embodiments, impulse force dampers substantially absorb impulse forces created by physical movement of transducer along the vibration axis.

Figure 11:
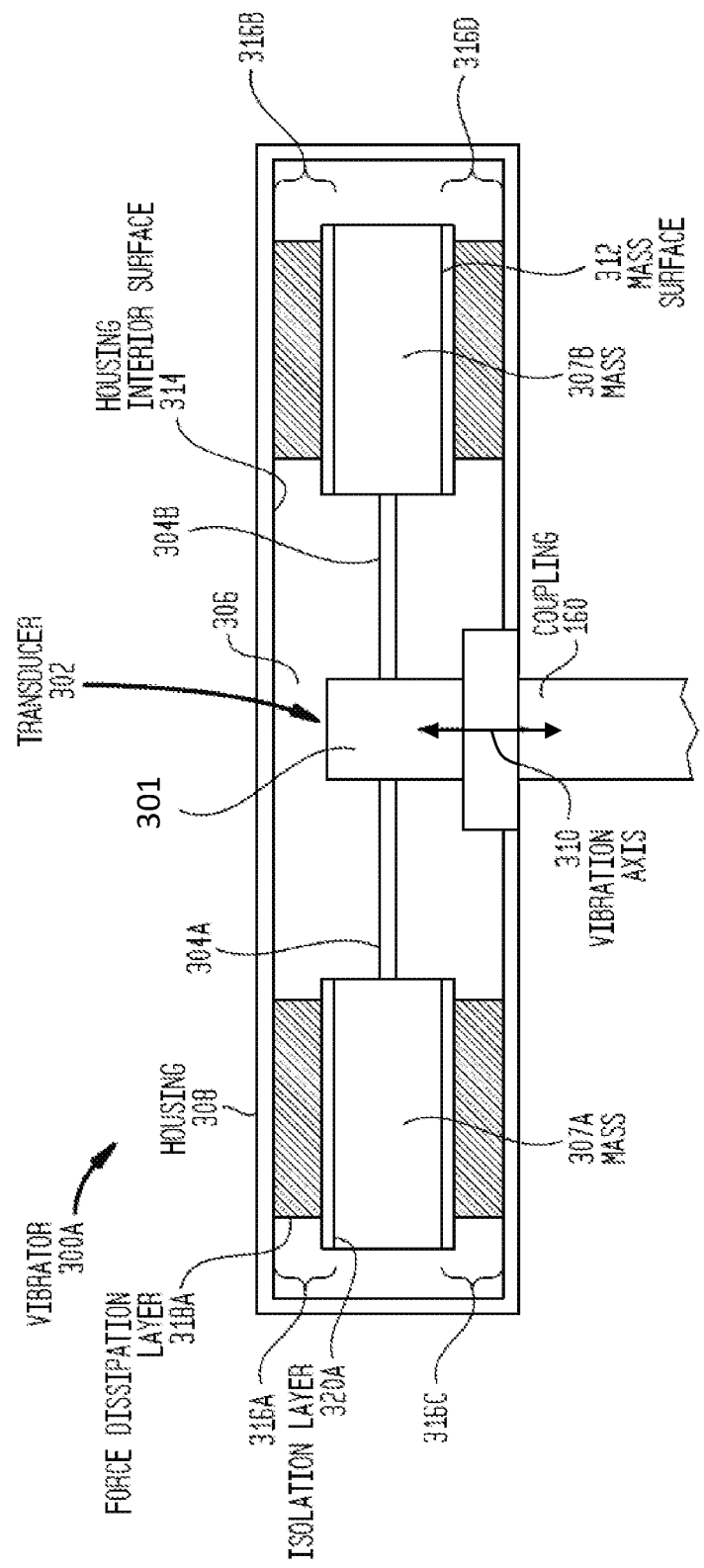
FIG. 11 presents another exemplary shock-proofing apparatus.

Referring to FIG. 11, vibrator 300A has a transducer 302 supported by a support 301 which is mechanically fixed to the wall of the housing 308. The transducer 302 includes a piezoelectric component that includes sides 304A, 304B, respectively (which collectively correspond to piezoelectric component 555 detailed above), where masses 307A, 307B are supported by the piezoelectric component in general, and the sides 304A and 304B respectively. In some embodiments, the interior of the housing 308 is filled with an inert gas 306. In an exemplary embodiment, the interior of the housing 308 is filled with argon.

Each mass 307 is formed of material such as tungsten, tungsten alloy, brass, etc., and may have a variety of shapes. Additionally, the shape, size, configuration, orientation, etc., of each mass 307A and 307B can be selected to increase the transmission of the mechanical force from piezoelectric transducer 302 to the recipient's skull and to provide a utilitarian frequency response of the transducer. In certain embodiments, the size and shape of each mass 307A and 307B is chosen to ensure that there is utilitarian mechanical force is generated and to provide a utilitarian response of the transducer 302.

In specific embodiments, masses 307A and 307B have a weight between approximately 1 g and approximately 50 g (individually). Furthermore, the material forming masses 307 can have a density, e.g., between approximately 2000 kg/m3 and approximately 22000 kg/m3. As shown, the vibrator includes a coupling 160 which is presented in generic terms. In some embodiments, the coupling is a coupling that connects to a bone fixture, while in other embodiments the coupling is a coupling that connects to a skin interface pad that abuts the skin of the recipient.

Transducer 302 is suspended in housing 308 such that there is a distance between the housing 308 and the masses, which enables vibration of transducer 302 in vibration axis 310. In the embodiment illustrated in FIG. 11, impulse force damper assemblies 316A-D are disposed between housing interior surface 314 and the adjacent surfaces 312 of masses 307 to substantially fill the respective distances between housing interior surface 314 and juxtaposed mass surface 312. In at least some embodiments, impulse force damper assemblies 316A-D limit or otherwise prevent a rapid acceleration and deceleration of masses 307A and B. Such movement may cause a significant impulse force to be applied to piezoelectric component. For ease of description, impulse force damper assembly 316A will be described below. With the exceptions noted below, the description of impulse force damper assembly 316A applies to impulse force dampers assemblies 316B-D.

In certain embodiments, impulse force damper assembly 316A includes at least two layers, an elastic force dissipation layer 318A and an isolation layer 320A.

Thus, exemplary impulse force damper assembly 316A is configured to achieve impulse force dissipation through a combination of deformation of an elastic material exhibiting sufficiently low stiffness and shear damping via substantial gross slip along the interface where a surface of impulse force damper assembly 316A abuts an adjacent layer or surface. In one embodiment, impulse force dissipation layer 318A comprises a cured liquid silicone rubber.

In certain embodiments, impulse force dissipation layer 318A comprises a material having one of more of the following: an ASTM technical standard D2240 Durometer Type OO scale value less than or equal to about 40; a Tensile Strength of about 325 psi; an Elongation of about 1075%; a Tear Strength of about 60 ppi; a Stress at 100% Strain of about 10 psi; a Stress at 300% Strain of about 30 psi; and a Stress at 500% Strain of about 65 psi. A commercially available example of such a material is Model No. MED 82-50 1 0-02 (a type of liquid silicone rubber) manufactured by NUSIL® Technology, LLC, in a cured state.

Thus, in the embodiment of FIG. 11, impulse force dissipation layer 318A is configured to exhibit non-negligible adhesion to housing surface 314 and substantially no adhesion to isolation layer 320A. This enables impulse force damper 316A to dissipate energy through a combination of deformation and shear damping along the interface between with isolation layer 320A. Shear damping refers to the lateral sliding or slipping of the layers 318A and 320A, which is possible due to lack of adhesion between the layers.

Figure 12:
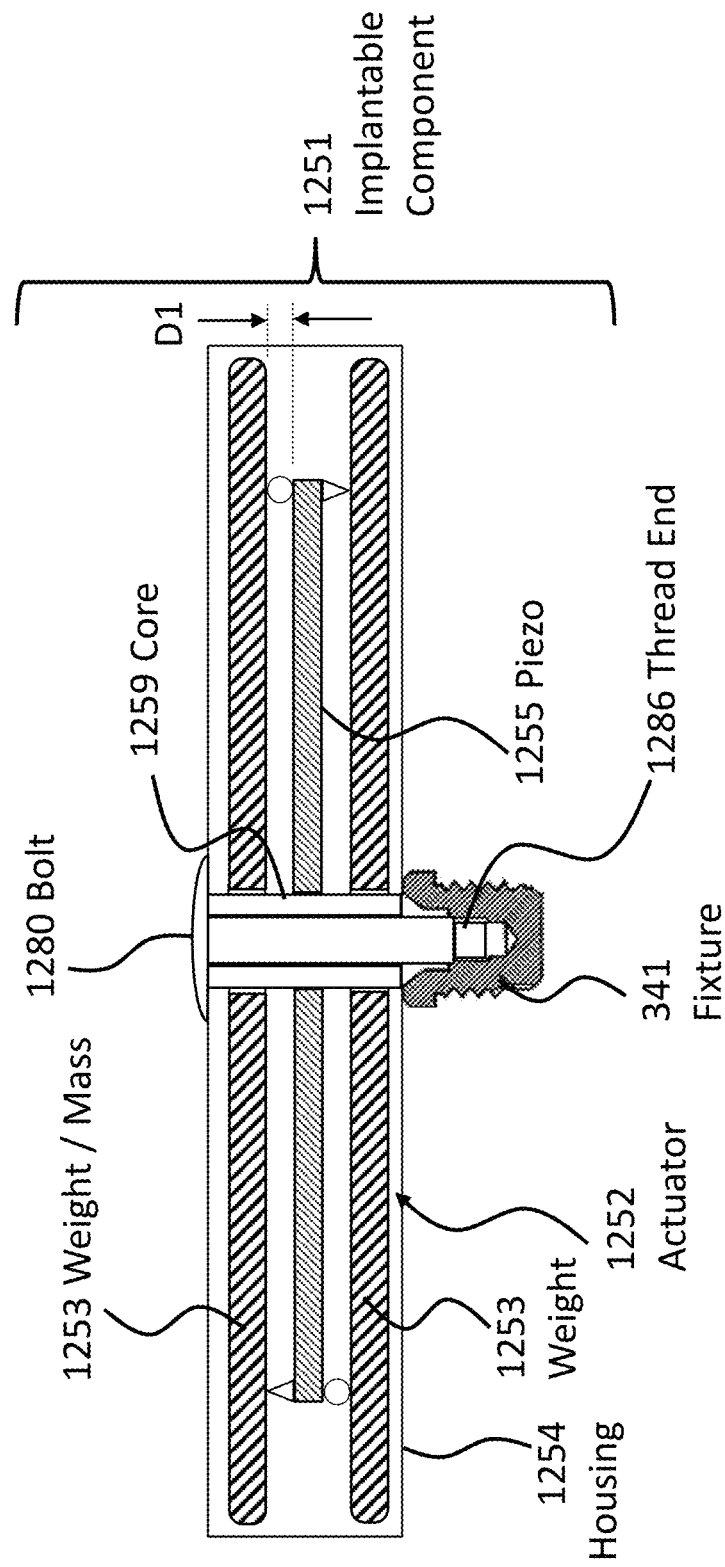
FIG. 12 presents an exemplary embodiment of an exemplary shock-proofing apparatus.

FIG. 12 depicts an exemplary embodiment of an exemplary implantable subcomponent 1251 having utilitarian value in that such can reduce the likelihood of the occurrence of (which includes eliminate the possibility of occurrence of) the failure mode associated with that depicted in FIG. 7, and the variations detailed above. FIG. 12 depicts a cross-section through the geometric center of the subcomponent 1251 (which is sometimes referred to herein as component, for linguistic simplicity). Implantable subcomponent 1251 includes a housing 1254 that encases an actuator 1252, which actuator includes a piezoelectric material 1255 corresponding to that of FIG. 7, and a counterweight 1253 that functionally, with respect to evoking a hearing percept, corresponds to the counterweight 553 above, in that it establishes at least part of a seismic mass.

In the embodiment of FIG. 12, bolt 980 extends to the bone fixture 341 and is screwed therein during attachment of the housing 954 to the already implanted bone fixture 341 so as to establish the implantable component 951. In this regard, bolt 1280 includes a male threaded end 1286 that threads into female threads located within bone fixture 341. This operates as an effective jackscrew to pull the head of the bolt 1280 downward towards the bone fixture 341, thus driving the housing 1254 onto the fixture 341, thus securing the housing to the fixture 341. As seen, core 1259 separates the passage for the bolt from the interior of the housing. It is noted that in alternate embodiments, the bolt does not extend through the housing, but instead the threaded boss is attached to the outside of the housing. The piezo 1255 is fixed to the core 1259 (more on this below).

Exemplary embodiments for the below embodiments will typically be described in terms of an implantable housing/implantable sub-component of a bone conduction device. However, the below teachings are also applicable to passive transcutaneous bone conduction devices and percutaneous bone conduction devices where the housing, etc., is located outside the recipient. Thus, any disclosure herein with respect to an implantable device corresponds to a disclosure of another embodiment where the device is not implantable or otherwise as part of a component that is external to the recipient.

Still with reference to FIG. 12, the counter weight 1253 is fixed to the piezoelectric material 1255 in the traditional manner that allows the piezoelectric material 1255 to flex (hence the triangle and circle components—it is noted that while the embodiment shows a circle on one side and a triangle on the other side—both horizontally and vertically, in an exemplary embodiment, the triangles can be on one side and the circles on the other—both horizontally and vertically. Any arrangement that can have utilitarian value can be used that will enable the teachings herein unless otherwise noted.). In an exemplary embodiment, the piezoelectric material is pin connected to the counterweight on one side, and roller connected to the counterweight on the other side. While the embodiment depicted in FIG. 12 shows the pinned/roller connection to be reversed on the bottom relative to the top, in some embodiments, this is not the case. Still, the embodiment of FIG. 12 is believed, but not to be bound by theory, to be a configuration where the movements of the counterweights 1253 in the lateral direction offsets each other so that there is little to no rocking (e.g., little to no torque on the plane of FIG. 12). In this regard, when the piezo bends upward, with respect to the embodiment of FIG. 12, the top mass 1253 is moved to the right, and the bottom masses moved to the left, where, in at least some embodiments, the movements are equal and opposite one another, or at least effectively equal and opposite to one another. When the piezo bends downward, the reverse is the case. Accordingly, in an exemplary embodiment, the embodiment of component 1251 provides effectively no torque during operation thereof.

Briefly, in an exemplary embodiment, the pinned fixation can be achieved by utilizing pin and interleaved devises. The roller connection can be achieved by, for example, a sliding clamp arrangement, or can be achieved by a hinged device that is configured to compensate or otherwise permit the relative movements between the two components. It is also noted that both sides can be pin connected while in other embodiments both sides can be roller connected, and while in further embodiments, one or both sides can be fixedly connected, providing that the material is configured to expand and/or contract to enable the effective use of the component for bone conduction or the like. In this regard, it is noted that the amount of the flexion of the piezoelectric material is very very small, and thus it is possible that the fixation regimes where all portions are fixed can be utilitarian (in reality, the fixation is not rigid—it is that what would be deemed a rigid system with respect to larger movements is a flexible system for the smaller movements, depending on the embodiment).

Figure 13:
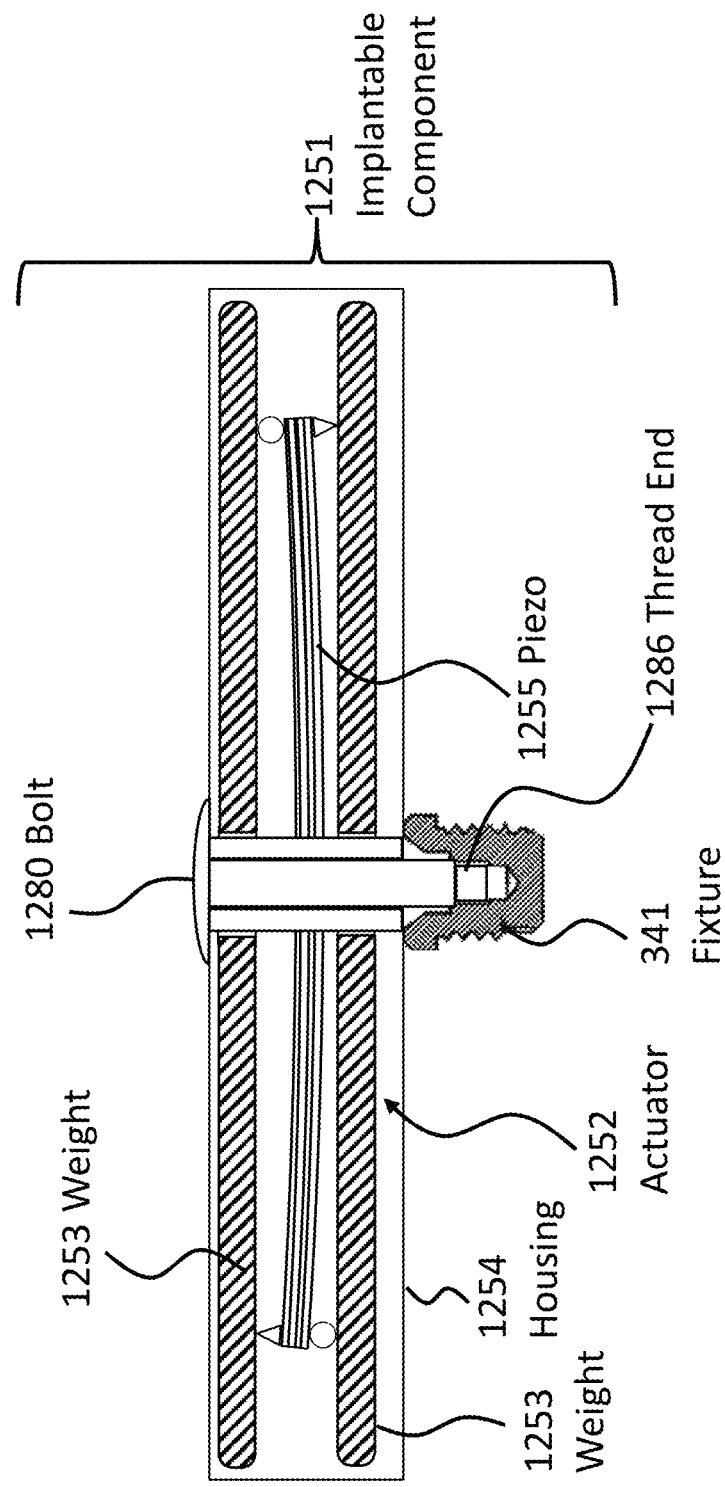
FIGS. 13 and 14 present the embodiment of FIG. 12 in operation.
Figure 14:
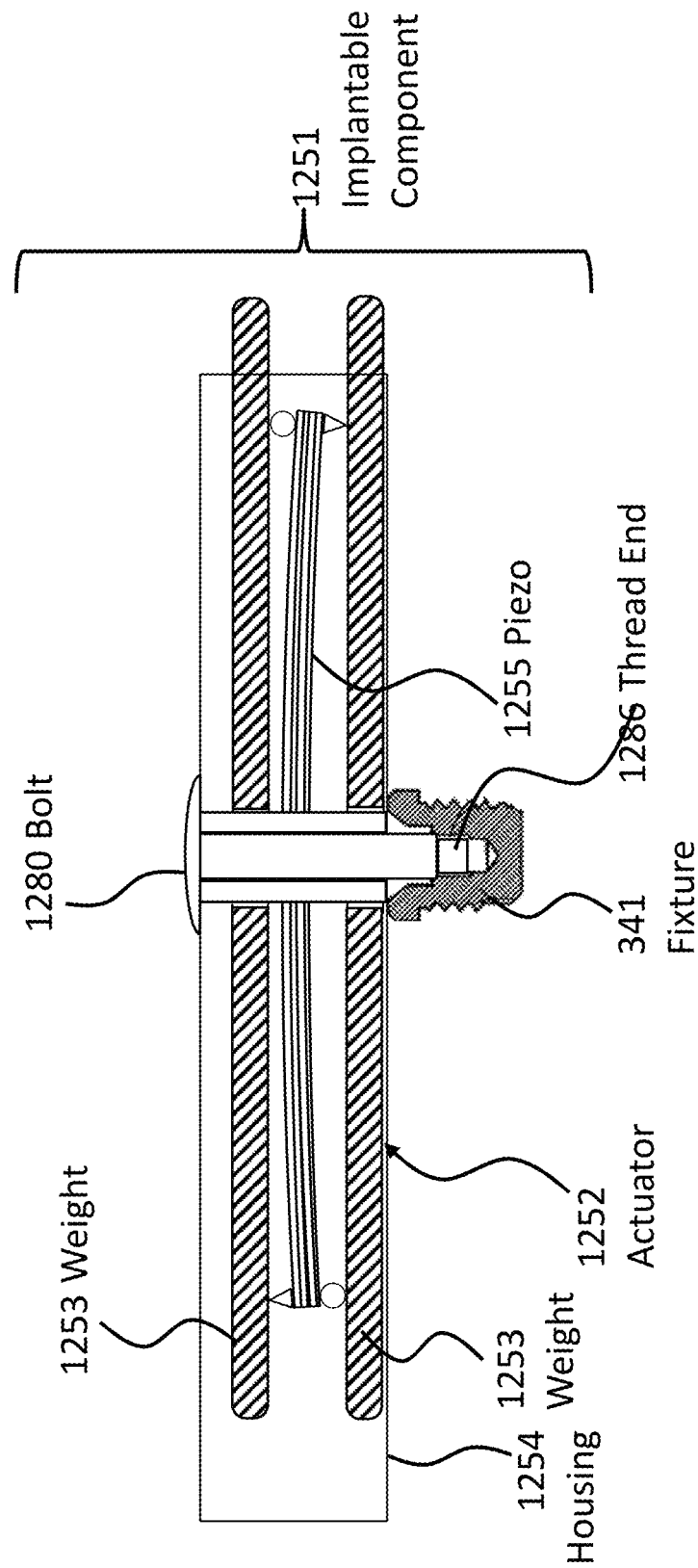

FIGS. 13 and 14 depict an exemplary scenario of use of component 1251 to evoke a hearing percept. As can be seen, piezo 1255 bends upward in FIG. 13 owing to the application of a first voltage applied to the piezoelectric material, and then bends downward in FIG. 14 owing to a second voltage applied to the piezoelectric material, which voltage can be the reverse of the first voltage. In this regard, in an exemplary embodiment, the static/at rest/non-energized position of the piezo is that shown in FIG. 12. That said, it is noted that in at least some exemplary embodiments, the piezoelectric material 1255 can have an at rest/non-energized configuration where there is a pre-bend. In this regard, FIG. 14 or FIG. 13 could be the non-energized state, and then the energized state would bend the piezo in the opposite direction, etc. such can have utilitarian value with respect to providing a pre-stressed system (more on this below).

Figure 15:
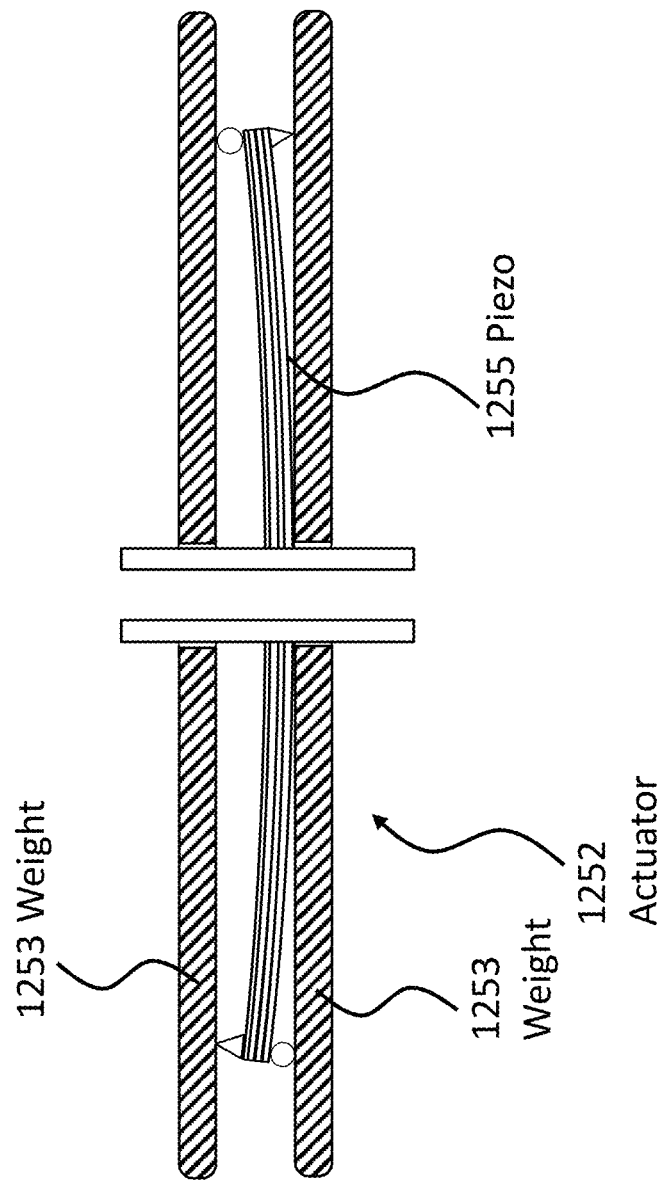
FIG. 15 presents the embodiment of FIG. 12 in a high G environment.

The movements of FIGS. 13 and 14 depict in a conceptual manner how the components of the system move relative to one another during normal operation. As noted above, there are scenarios where the component 1251 is subjected to an environment, such as a high G environment, which could result from dropping the component 1251 off of a table onto a floor or the like, where the piezoelectric material would bend or otherwise flex beyond that which is the case during normal operational use of the component to evoke a bone conduction hearing percepts. In an exemplary situation where the implantable component does not have the inventive features according to the teachings detailed herein, and depending on the G environment, this could be bad in that it could be a failure mode where the piezoelectric material is overstressed or otherwise experiences flapping, etc. By sizing and dimensioning the arrangement of FIG. 12 accordingly, it is possible to prevent the failure mode by limiting the amount of bending of the piezoelectric material. FIG. 15 presents an exemplary scenario where the component is subjected to a high gravity environment, and the structure of the component limits the amount of bending of the piezoelectric material. In this regard, FIG. 15 represents some of the components of FIG. 12, with other components removed for clarity. Here, a scenario is represented where a downward acceleration (relative to the page) is applied that results in the counter masses 1253 pulling and pushing, respectively, the piezo 1255 so that it bends beyond the amount that it is intended to bend or otherwise bends during normal operation. Here, the component is sized and dimensioned such that the counter mass 1253 on the bottom contacts the bottom of the piezo 1255 and prevents the piezo 1255 from bending any further. It is briefly noted that in an exemplary embodiment, both of the masses 1253 can be directly connected to one another, while in other embodiments the masses are only indirectly connected to one another via the piezo 1255. With respect to the former, the bottom mass 1253 prevents the topmast from moving any further, in some embodiments, depending on the arrangement. With respect to the latter, the piezo, which is now restrained from further movement, prevents the top mass 1253 from moving any further.

It is briefly noted that while the embodiments detailed herein, such as the embodiment of FIG. 12, is presented in terms of the housing 1254 being connected to the bone fixture 341, in some alternate embodiments, there is no bone fixture 341. In this regard, in an exemplary embodiment, the housing 1254 is located in a recess in the bone, which could be a press-fit or a slip fit or otherwise could be adhered to the bone utilizing a biocompatible adhesive or the like. Still further, in an exemplary embodiment, the housing 1254 could be located flush with the surface of the bone. Any arrangement that can enable the teachings detailed herein can be utilized in some embodiments. Consistent with the teachings detailed herein, the aforementioned configuration be utilized with any of the housing detailed herein and variations thereof providing that the art enable such unless otherwise noted.

In the embodiment depicted in FIG. 15, it can be seen that in an exemplary embodiment, there is a seismic mass transducer, such as the component attached to the bone fixture of FIG. 12, or in other embodiments, where there is no bone fixture such as in a variation thereof, wherein there is a seismic mass, such as masses 1253, and a transducer, such as piezoelectric component 1255. In this exemplary embodiment, the seismic mass is configured to contact the transducer to prevent over-the flexion of the transducer, such as seen in FIG. 15. In an exemplary embodiment of this embodiment, the transducer is configured to deflect to cause transduction.

Still further, in an exemplary embodiment the transducer has a peripheral edge that extends about the periphery of the transducer, and the transducer is configured to deflect about a location inboard of the peripheral edge to cause transduction. This can be seen in FIGS. 13 and 14 for example. Still further, concomitant with the aforementioned figures, again where the transducer has a peripheral edge that extends about the periphery of the transducer, in at least some exemplary embodiments, the seismic mass transducer has an input and/or an output coupling that connects to the transducer at a location inboard of a peripheral edge.

Again, some exemplary embodiments of utilitarian value with respect to preventing over deflection of the piezoelectric component. In this regard, at least some exemplary embodiments include a seismic mass transducer wherein the transducer has a peripheral edge that extends about the periphery of the transducer, and the seismic mass is configured to contact the transducer at a location inboard of a peripheral edge (e.g., as seen in FIG. 15) to prevent over-deflection at a location on the peripheral edge. In this regard, the over deflection is measured at the peripheral edge relative to the part that does not deflect or otherwise deflects the least (e.g., the center in an exemplary embodiment).

Further, as seen in these exemplary embodiments under discussion, there is a seismic mass transducer wherein the transducer has a peripheral edge that extends about the periphery of the transducer, and the seismic mass is coupled to the transducer only at the peripheral edge. In some other embodiments, the seismic mass is coupled to the transducer only at a location proximate the peripheral edge (e.g., slightly inboard of the peripheral edge). That said, in some alternate embodiments, the coupling is located elsewhere. Any location of the coupling that can have utilitarian value can be utilized in at least some exemplary embodiments. To be clear, this corresponds to any of the couplings detailed herein. As will be disclosed in greater detail below, the seismic masses generally eclipse the transducer 1255 in at least some exemplary embodiments when viewed from the above. That said, in some exemplary embodiments, this is not the case. In some exemplary embodiments, as seen in FIG. 12, the masses extend beyond the ends of the transducer, while in other embodiments, this is not the case. In some embodiments, the ends of the masses are flush with the ends of the transducer and in other embodiments, are somewhat inboard of the transducer.

Still, concomitant with the teachings detailed herein, in an exemplary embodiment, the seismic mass substantially covers one side of the transducer. In other embodiments, the seismic mass does not substantially covers one side of the transducer.

As seen in FIGS. 13 and 14, the movements of the piezoelectric component resulting from transduction results in the tips of the piezoelectric component moving upward and/or downward and thus inward (from the planar state). Accordingly, in an exemplary embodiment, the seismic mass transducer according to an exemplary embodiment is such that the peripheral edge of the transducer is configured to move inwardly relative to the seismic mass when the transducer deflects.

It is briefly noted that in an exemplary embodiment, the seismic masses the collective weight that is greater than the collective weight of the transducer components. In an exemplary embodiment, the collective weight of the seismic masses is at least 5, 10, 15, 20, 25, 30, 35, 40, 45, 50, 55, 60, 65, 70, 75, 80, 85, 90, 95, 100, 125, 150, 175, 200, 250, 300, 350, 400, 450 or 500 or 600, or 750 or 1000 or 1500 or 2000 or 2500 or 3000 times or more the collective weight of the transducer, or any value or range of values therebetween in integer increments.

It is also briefly noted that in an exemplary embodiment, the counter mass is a single monolithic component that is machined out to provide space for the transducer component and/or the couplings. In an exemplary embodiment, the counter mass constitutes two shells (that term is used loosely—the walls can be quite thick) that envelop the transducer. Indeed, in an exemplary embodiment, there is a method of manufacturing where the transducer is fixed to the center column, and then the vibrational double-sided tape is placed onto the tips of the transducer (top and/or bottom on one or both sides), and then the separate "shells" are brought over the column/slid along the column so that they completely or partially envelop the transducer. In this regard, the separate shells can have sidewalls that extend around one or more or all of the lateral sides of the transducer so as to air tight or even hermetically isolate the transducer from the outside environment of the shells, save for the opening(s) in the shell(s) for the column. Moreover, in an exemplary embodiment, a seal or the like can be located around the column to provide a modicum of sealing, which sealing could be hermetic and/or airtight or at least provides more of a barrier to the movement of gas into the inner volume of the shell and/or out of the outer volume of the shell than that which would otherwise be the case in the absence of the seal.

To be clear, in an exemplary embodiment, there is a method of manufacturing the seismic masses that entails hogging out two tungsten plates or bodies to provide room for the transducer and/or the couplings, and then taking the two hogged out sections and respectively utilizing those sections to establish a volume about the transducer. In an exemplary embodiment, adhesive or some other joining device, such as screws, etc., can be utilized to screw the two hogged out components together.

Such can have utilitarian value with respect to providing a seismic mass transducer, where the transducer of the seismic mass is a piezoelectric elements.

In the embodiment depicted in FIG. 15, the counter mass 1253 contacts the piezo 1255 at inboard locations of the piezo. Because the mass 1253 is rigid, upon contacting the piezo 1255, whereupon such contact, further movement along the core 1259 is prevented, the mass 1253 holds the piezo 1255 from bending any further. It is noted that in an exemplary embodiment, the implantable component is sized and dimensioned so that in the event of an acceleration in the opposite direction that would otherwise cause the bending of the piezoelectric material beyond that which is desired or otherwise utilitarian, the opposite of that depicted in FIG. 15 results, where the top mass 1253 contacts the piezo 455 at the inboard location and prevents further downward bending of the piezo 1255.

By sizing and dimensioning the component in a utilitarian manner, the above-detailed contact between the mass 1253 and the piezoelectric material can shockproof the component by preventing the piezoelectric material from bending by an amount that would cause permanent failure.

Figure 16:
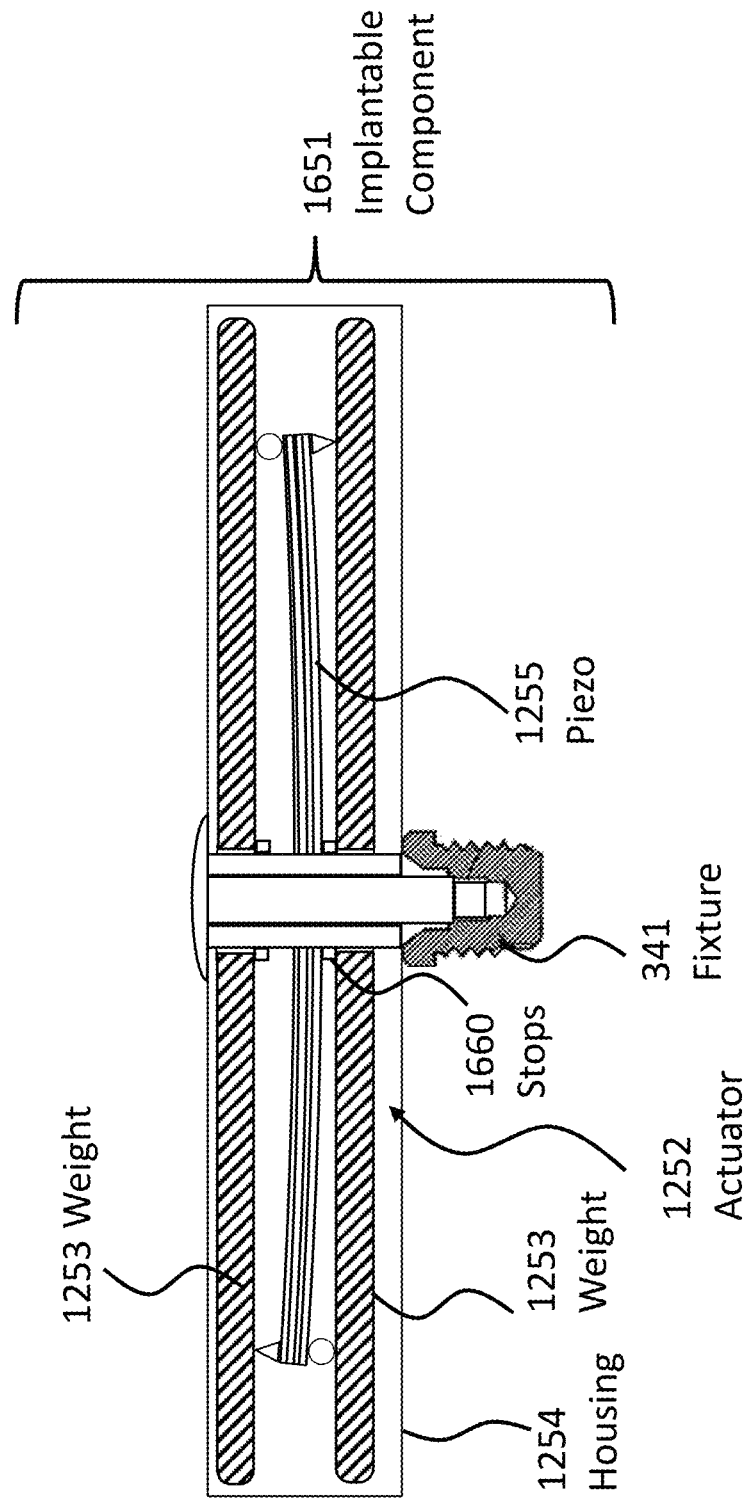
FIGS. 16 and 17 present alternate embodiments of the embodiment of FIG. 12.

While the embodiment detailed above has been presented in terms of direct contact between the mass 1253 (e.g., a tungsten body, for example) and the piezoelectric material 1255, in an alternate embodiment, the mass 1253 contacts the piezoelectric material 1255 indirectly via an intermediate component. In this regard, by way of example only and not by way of limitation, FIG. 16 presents an exemplary implantable component 1651 which includes stops 1660 located between the piezoelectric material 1255 and the masses 1253. In this embodiment the masses 1253 contact the piezoelectric material 1255 via the stops 1660. In an exemplary embodiment, stops 1660 are washer components that are fixed to the masses 1253 and move with movement of the masses 1253. That said, in an alternative embodiment, the stops 1660 can be discreet components that do not necessarily surround the core 1259. Indeed, in an exemplary embodiment, it is possible that some embodiments can include only one stop component 1660 located on one side of the core on each side of the bender 1255. In an exemplary embodiment, stop component 1660 can be a stud component or even an extension of the body of the mass 1253 that is monolithic with the body of the mass 1253. In this regard, the aforementioned extension can also be the case with respect to a scenario where the stop component 1660 extends about the core 1259.

It is noted that in at least some exemplary embodiments, the stops can be rigid components while in other embodiments, the stops can be flexible components. In an exemplary embodiment, the stops can provide a cushioning between the seismic mass and the transducer element.

Speaking of rigidity and flexibility, it is briefly noted that in some exemplary embodiments, a feature of the seismic masses is that such have sufficient structural integrity that the act as rigid bodies from one end to the other and/or relative to one another. By way of example only and not by way of limitation, the seismic masses could be relatively thin compared to other embodiments, but that thinness would not be so thin that the seismic masses would flex or bow, although in other embodiments, the seismic masses could flex or bow. Moreover, with respect to providing a rigid body, in at least some exemplary embodiments, a non-homogeneous cross-sectioned seismic mass is utilized. Moreover, while the embodiment depicted in FIG. 12 presents two separate seismic masses. In at least some exemplary embodiments, by rigidly connecting the two together, such can provide additional rigidity to the individual components relative to that which would be the case separately.

Figure 17:
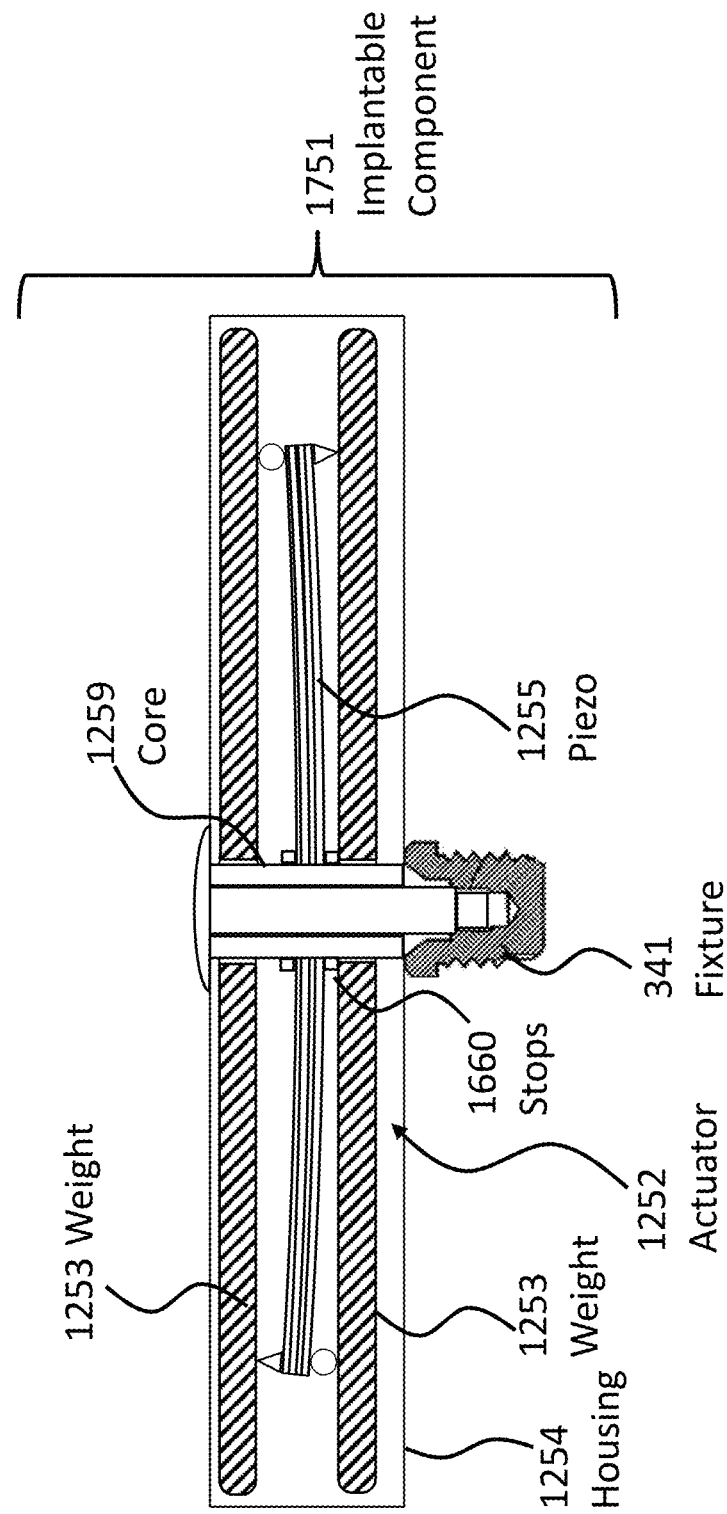

FIG. 17 presents an alternate exemplary embodiment of an implantable component 1751, where the stop component is fixed relative to the core 1259. In this regard, washers are located on either side of the bender 1255 and are fixed to the core 1259 and/or the bender 1255. In an exemplary embodiment where the stops 1660 are fixed to the core 1259, when the mass contacts the stops, in at least some exemplary embodiments, the energy that results from the contact is not transferred to the bender or otherwise the amount of energy that is transferred to the bender is less than that which would otherwise be the case in a manner that has utilitarian value with respect to protecting the bender from damage.

Any arrangement that can enable the teachings detailed herein that utilizes stops and/or does not utilize stops can be utilized in at least some exemplary embodiments. In this regard, any device, system, and/or method that will enable the bending of the piezoelectric material 1255 to be limited when exposed to a high G environment comments on the principles detailed herein can be utilized in at least some exemplary embodiments.

In view of the above, it can be seen that in an exemplary embodiment, there is a component of a bone conduction device, which component can be an implantable component or the removable component of a percutaneous and/or passive transcutaneous bone conduction device, which component comprises a housing and a piezoelectric bender located in the housing. In an exemplary embodiment, the component is configured to limit bending of the piezoelectric bender relative to that which would otherwise be the case in the absence of the limits. In an exemplary embodiment of this exemplary embodiment, this limitation is achieved via application of a stopping force at a centralized location of an assembly of which the bender is a part. This is different from, for example, the embodiment of FIG. 11 above. The assembly of which the bender is a part can include the core 1259 and the transducer-seismic mass assembly.

In an exemplary embodiment of the embodiment where the component is configured to limit bending of the piezoelectric bender relative to that which would otherwise be the case in the absence of the limits, this limitation is achieved via application of a stopping force that is located at or within a distance that is 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, or 35% or any value or range of values therebetween in 0.1% increments of a total span length from a geometric center of the span.

In an exemplary embodiment, the assembly of which the piezoelectric bender is a part is a transducer-seismic mass assembly, wherein the component is configured such that the transducer-seismic mass assembly is at all times free to move in an operational manner. That is, in an exemplary embodiment, where the transducer is a piezoelectric bender, the piezoelectric bender is always free to bend. By way of example only and not by way of limitation, at all times, upon the application of a sufficient voltage so as to operate the component to implement bone conduction hearing, the bender will bend. In this regard, there is no locking device or the like that locks or otherwise prevents movement of the bender, which locking device could be removed so as to enable the component to operate for bone conduction.

As will be understood in view of the teachings detailed above, in at least some exemplary embodiments, the bending of the piezoelectric bender is limited by the same amount in the complete absence of the housing. That is, the housing does not limit or otherwise is not part of a bending limiting assembly that requires the housing to achieve bending limiting. In this regard, the FIGS. 15 and 16 are salient in that they depict the limitation in the complete absence of the housing. That is, the bending limitation will exist with respect to the components seen in only those figures in addition to components that cause the bending to take place. Indeed, the housing and/or the core 1259 can be removed and the bending limitation would still exist. This as contrasted to, for example, the embodiment of FIG. 11 above indeed, this can also be as contrasted to, for example, the embodiment of FIG. 9 above, which requires the housing.

In some embodiments, the assembly of which the piezoelectric bender is a part is a transducer-seismic mass assembly, wherein the stopping force is applied by a structure and/or a portion of a structure that is totally within the transducer-seismic mass assembly. This corresponds to the embodiments detailed above without a stopper, as well as the embodiments with a stopper, irrespective of how the stopper is mounted. In this regard, in an exemplary embodiment where the stopper and the core form a monolithic component, the portion of that structure is still totally within the transducer-seismic mass assembly as the stopper exists irrespective of any portion of the structure outside of the transducer-seismic mass assembly.

Figure 18:
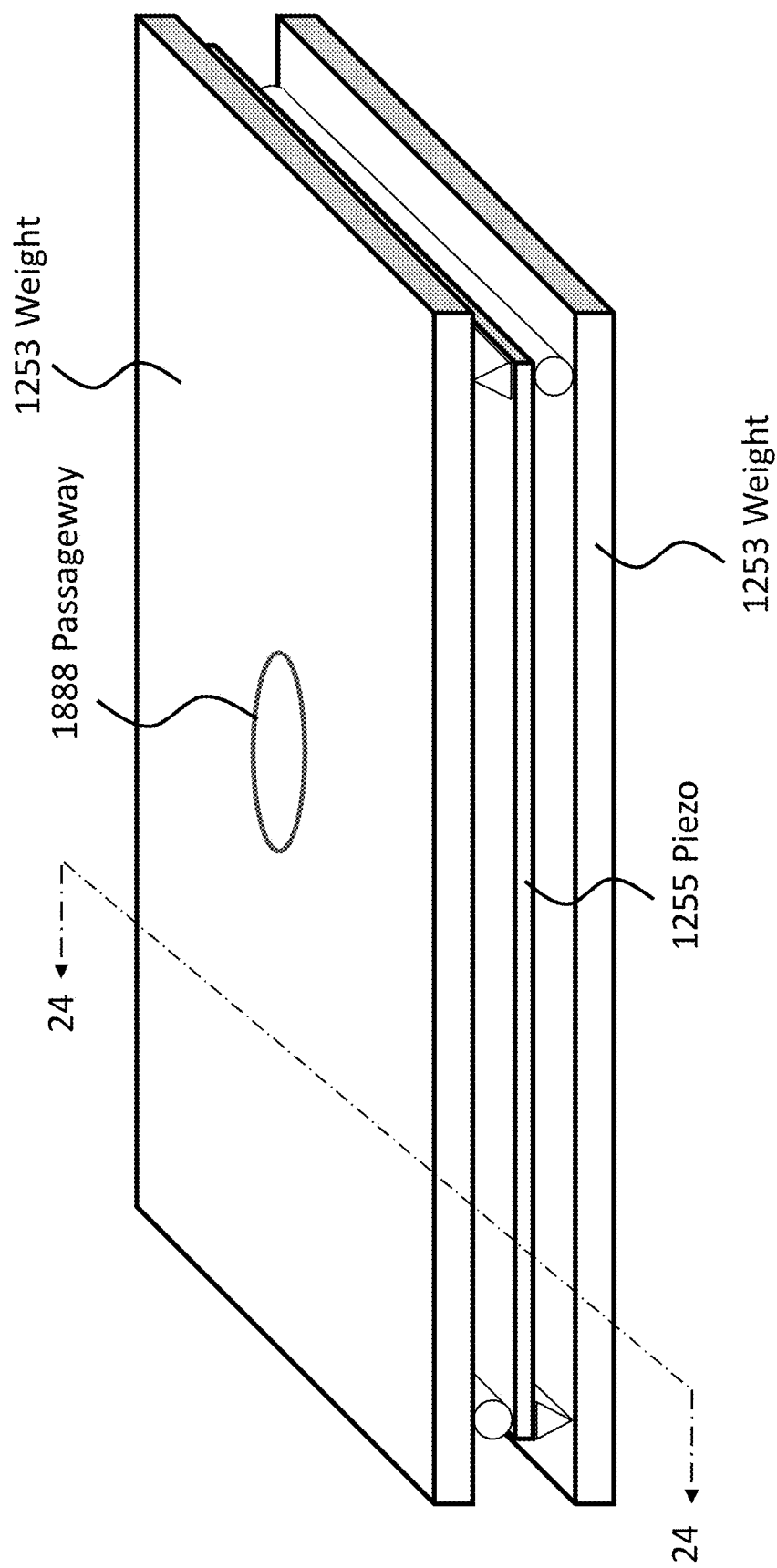
FIG. 18 presents a conceptual isometric view of the embodiment of FIG. 12.

Moreover, in an exemplary embodiment, there is the component of a bone conduction device, where the assembly of which the piezoelectric bender is a part is a transducer-seismic mass assembly, wherein a seismic mass of the seismic mass assembly envelops the bender. In this regard, as can be seen from the embodiments shown, the masses 1253 extend past the borders of the span of the bender. When viewed from the bottom or the top, the edges of the masses 1253 eclipse the edges of the bender 1255. FIG. 18 presents an isometric view of a conceptual transducer-seismic mass assembly according to an exemplary embodiment. (Some additional features of this arrangement will be described below.) Conversely, the embodiments of FIG. 9 and FIG. 11 are not arrangements where the seismic mass of the assembly envelops the bender. FIG. 18 also shows a passageway 1888 that extends through the top (or bottom) seismic mass 1253 to the transducer 1255. In an exemplary embodiment, this can enable a passageway for the support that attaches the transducer 1255 to the housing.

Still, in an exemplary embodiment, the seismic mass of the seismic mass assembly includes a first portion and a second portion, the first portion and the second portion extending along a span of the bender from one side to the opposite side in the span direction, the first portion being on one side of the bender and the second portion being on the opposite side in the bend direction. By span, it is meant the direction of the bender that is in the plane of bending (e.g., from left to right or from right to left in the FIG. 12, as opposed to in and/or out of the page of FIG. 12). By analogy, the span of the wings of an aircraft are from wingtip to wingtip, and wings "flap" over the course of a flight (the tips go up and down).

Figure 19:
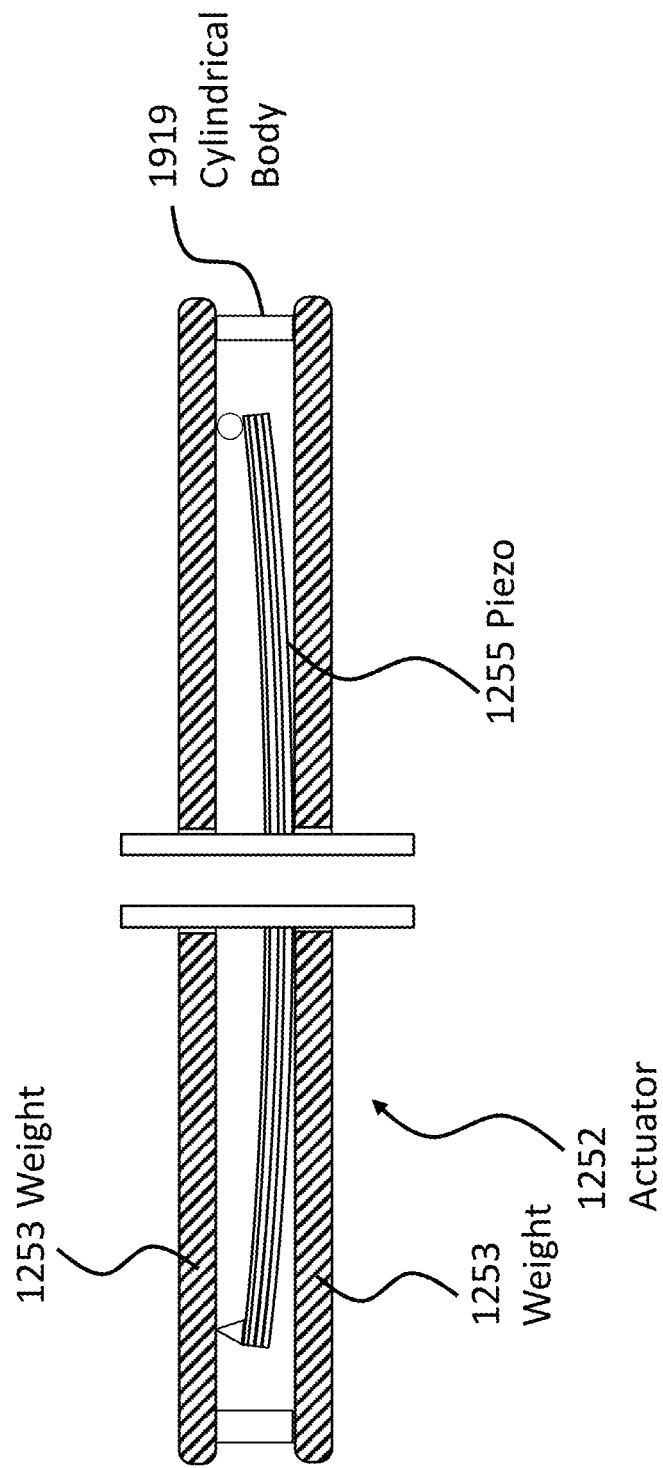
FIGS. 19 and 20 present alternate embodiments of the embodiment of FIG. 12, where the seismic mass is a single seismic mass arrangement.

With respect to the first portion and the second portion, in an exemplary embodiment, the first portion can be the top mass 1253, and the second portion can be the bottom mass 1253, or vice versa. In this regard, in at least some exemplary embodiments, the masses are separate and distinct components. In an alternate exemplary embodiment, the masses are part of a single body (which can be a monolithic body while in other embodiments can be an integral body and that they are rigidly connected to each other). Some additional details of this will be described below. It is briefly noted that in an exemplary embodiment where the respective masses are rigidly connected to one another, in at least some exemplary embodiments, the pinned connections between the piezoelectric bender and the masses are located on one side of the core as opposed to one being located on one side and the other being located on the other. This enables the masses to have an orientation that is the same as the bender bends (i.e., no rotation in the plane of FIG. 12). This as opposed to what would be the case with respect to the embodiment where the first portion and the second portion are rigidly coupled to one another and the pinned couplings between the bender and the mass are located on opposite sides of the core. Indeed, in an exemplary embodiment, there is coupling between the bender and the mass only on one side of the bender. FIG. 19 depicts an exemplary embodiment of such an arrangement, where the top mass 1253 is rigidly connected to the bottom mass 1253 via cylindrical bodies 1919 that are welded to the masses.

Figure 20:
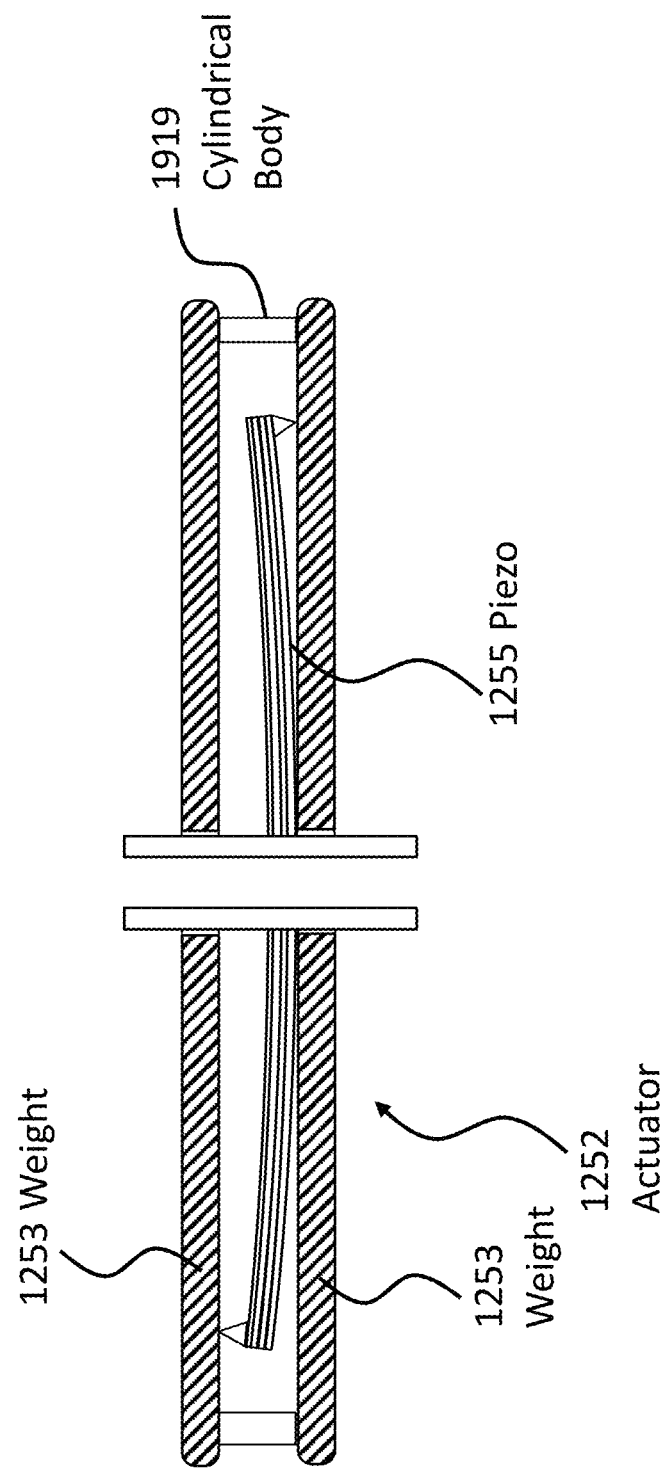

That said, in at least some exemplary embodiments, the pinned connections are located on both tips of the bender 1255 on opposite sides thereof, as seen in FIG. 20. No roller connections exist. In this exemplary embodiment, the masses rotate in the plane of the page when the bender bends.

In at least some exemplary embodiments of the exemplary embodiments under description, the first portion establishes a rigid body and the second portion establishes a rigid body. In an exemplary embodiment, the respective rigid bodies extend from the connections between the bender and the masses accordingly.

In an exemplary embodiment of the component of the bone conduction device, the assembly of which the piezoelectric bender is a part is a transducer-seismic mass assembly, the seismic mass of the seismic mass assembly includes a first portion which moves when the bender bends, and the component is configured such that the first portion contacts the bender upon a sufficient amount of bending, thereby shock-proofing the bender.

In an exemplary embodiment of the component of the bone conduction device, the assembly of which the piezoelectric bender is a part is a transducer-seismic mass assembly, the seismic mass of the seismic mass assembly includes a first portion which moves when the bender bends, and the component is configured such that the first portion contacts a component located between the bender and the first portion.

Thus, in view of the above, in in an exemplary embodiment of the component of the bone conduction device, the assembly of which the piezoelectric bender is a part is a transducer-seismic mass assembly, the seismic mass of the seismic mass assembly includes a first portion which moves when the bender bends, and the component is configured such that the first portion contacts a surface that is located on or between the bender and the first portion upon a sufficient amount of bending, thereby shock-proofing the bender.

It is noted that in an exemplary embodiment, the bender is fixed relative to the housing with respect to movement in all directions at a central location thereof. In this regard, in an exemplary embodiment, the piezoelectric bender is secured within the housing vis-à-vis the central location thereof in accordance with common practice for securing such a bender as is understood in the art. In an exemplary embodiment, a clamping arrangement exists. In an exemplary embodiment, the core 859 is a multi-peace component, where one part fits onto the top of the bender and the other heart fits onto the bottom of the bender, which clamps the bender therebetween in an immovable manner vis-à-vis the central location thereof.

Thus, in an exemplary embodiment, the piezoelectric bender is fixed or otherwise hard mounted to the core 1259, and thus the component provides a mounting force that is fixed, as compared to the mounting force of the embodiment of FIG. 9 above. In an exemplary embodiment, a through hole is located in the piezoelectric bender, through which the core 859 extends. In an exemplary embodiment, the bender is interference fitted around the core, while in other embodiments, the bender is clamped relative to the core. Any arrangement that will fix the bender to the court can be utilized in at least some exemplary embodiments.

It is briefly noted that in some exemplary embodiments, a portion of the piezoelectric component 855 located proximate the core 859 does not bend or otherwise flex or otherwise actuate when electricity is supplied thereto. In this regard, the piezoelectric components configured such that the bending portion is located beyond/outboard the outer boundaries of a central location. In an exemplary embodiment, as measured from the longitudinal axis of the implantable component, more than or less than 10%, 15%, 20%, 25%, 30%, 35%, 40%, 45%, 50%, 55%, 60%, 65%, 70%, 75%, 80% or more, or any value or range of values therebetween in 0.1% increments (22.3% to 34.2%, 25.7%, etc.) of the distance to the end of the piezoelectric component (the most outboard portion) is a portion that does not bend or flex or move when exposed to electricity. It is noted that the phrase piezoelectric component as used herein includes both the portion that flexes or otherwise moves when exposed to electricity, as well as the portion thereof that does not flex or otherwise move when exposed to electricity.

An exemplary embodiment of a bone conduction device comprises a housing and a piezo-seismic mass assembly, wherein the component is configured to enable permanent shock-proofing of the piezo transducer of the piezo-seismic mass assembly beyond that which results from damping. Further, as seen from the above, at least portion of the piezo-seismic mass assembly is fixed relative to the housing (as opposed to the embodiment of FIG. 9, where the transducer-seismic mass assembly is not fixed, but instead can move in its entirety. By permanent shock-proofing, it is meant that the shockproofing exists irrespective of the state of the bone conduction device. In this regard, some methods of shock proofing entail the utilization of devices that ultimately place the component into and out of a shockproof in state. Conversely, at least some exemplary embodiments are such that the shockproofing always exists and is otherwise always present.

In an exemplary embodiment, the permanently shock-proofing exists while a vibratory path extending from the piezo-seismic mass assembly to the housing remains in place when experiencing a G force that moves the assembly a maximum amount. This as contrasted to, for example, the embodiment of FIG. 9, where when the piezo-seismic mass assembly moves the maximum amount, the vibratory path is changed if it is present at all. Indeed, in an exemplary embodiment of this embodiment, the vibratory path remains exactly the same when experiencing the aforementioned G force. In an exemplary embodiment, the component is configured such that the vibratory path extending from the assembly to the housing remains in place even when subjected to shock and/or has the same path when subjected to shock.

In an exemplary embodiment, the component is configured such that the vibratory path extending from the assembly to the housing remains in place until the component is broken.

The piezo-seismic mass assembly includes a counterweight, as seen above. The permanently shock-proofing exists even though the component of the bone conduction device is configured to prevent the assembly, or any part carried by the assembly from striking the housing or any component directly supported by the housing upon subjecting the housing to a G force that would otherwise break the assembly in the absence of the shock-proofing. By way of example only and not by way of limitation, this differentiates from the embodiment of FIG. 11. This also differentiates from variations of the embodiment of FIG. 11, where there is a gap between the isolation layer in the housing or a gap between the isolation layer and the mass. When a sufficient G force environment exists, the mass comes into contact with the isolation layer and/or the isolation layer comes into contact with the housing. Conversely, the embodiment of FIG. 12 is configured such that the seismic mass only contacts the piezoelectric material or the stops, which are only indirectly supported by the housing.

In an exemplary embodiment, the piezo-seismic mass assembly includes a piezoelectric bender and one or more counterweights supported by the piezoelectric bender, the component of the bone conduction device is configured to apply an electrical current to the piezoelectric bender to cause the piezoelectric bender to bend in a vibratory manner, thereby moving the one or more counterweights towards and away from a surface of the housing in a vibratory manner. In this exemplary embodiment, the piezoelectric bender is operationally permanently fixedly supported relative to the housing and the component is configured such that vibrations from the piezoelectric bender travel therefrom to the housing to evoke a hearing percept. This as contrasted to the embodiment of FIG. 9, where the piezoelectric bender can move relative to the housing. Note that the phrase operationally permanently fixed does not exclude the scenario where the component can be disassembled to move to the bender. Operationally permanently fixed is that when the bone conduction device operates, the bender is fixed.

Further, in an exemplary embodiment where the piezo-seismic mass assembly includes a piezoelectric bender and one or more counterweights supported by the piezoelectric bender, the component of the bone conduction device is configured such that the one or more counterweights effectively do not rotate within the housing during operational use of the assembly to evoke a hearing percept. This as opposed to, for example, the embodiments of FIGS. 5, 9, and 11, where the counterweights rotate within the housing upon the bending.

Conversely, in an exemplary embodiment, the bone conduction device is configured such that the one or more counterweights rotate and there is no cancellation of moment created by rotation of one or more other counterweight again, as contrasted by the embodiments of FIGS. 5, 9, and 11. In an exemplary embodiment, the component is configured such that the one or more counterweights rotate within the housing during operational use of the assembly to evoke a hearing percept and the rotation is not counterbalanced by opposite rotation of another counterweight.

Figure 21:
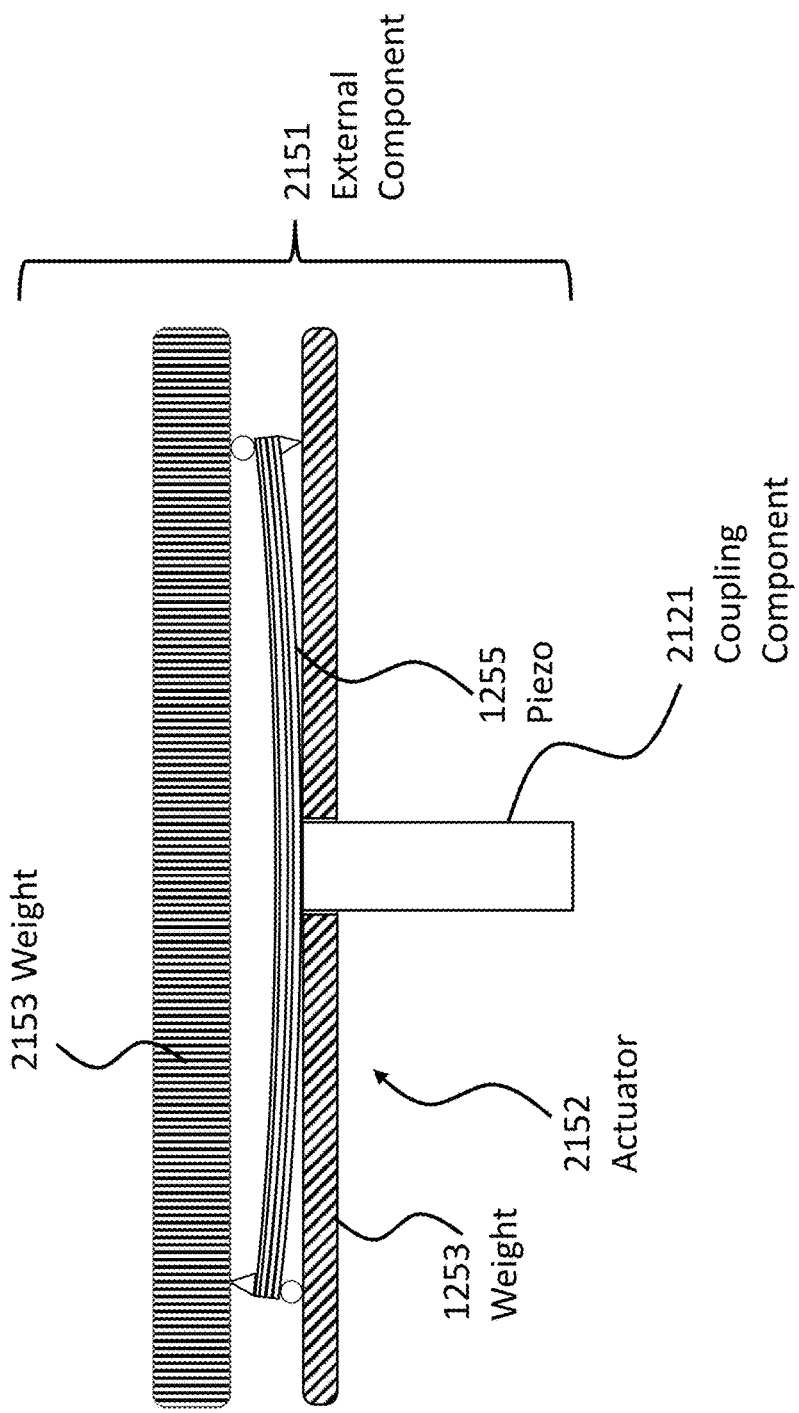
FIGS. 21 and 22 present exemplary embodiments of variations of the embodiment of FIG. 12.

FIG. 21 presents another exemplary embodiment of a component 2151 of a bone conduction device. This embodiment is presented in terms of a removable component of a percutaneous bone conduction device, although the principle is applicable to all of the embodiments herein. Here, the transducer-seismic mass assembly includes the bender 2155 as detailed above, and a counter mass 1253, but also includes a larger, more massive counter mass 2153. This embodiment shows that the counter mass is need not be separate and equal. Note also that in this embodiment, the coupling component 2121 does not extend through the bender 2155, but instead is connected thereto at the bottom thereof. The housing of the component is omitted.

Figure 22:
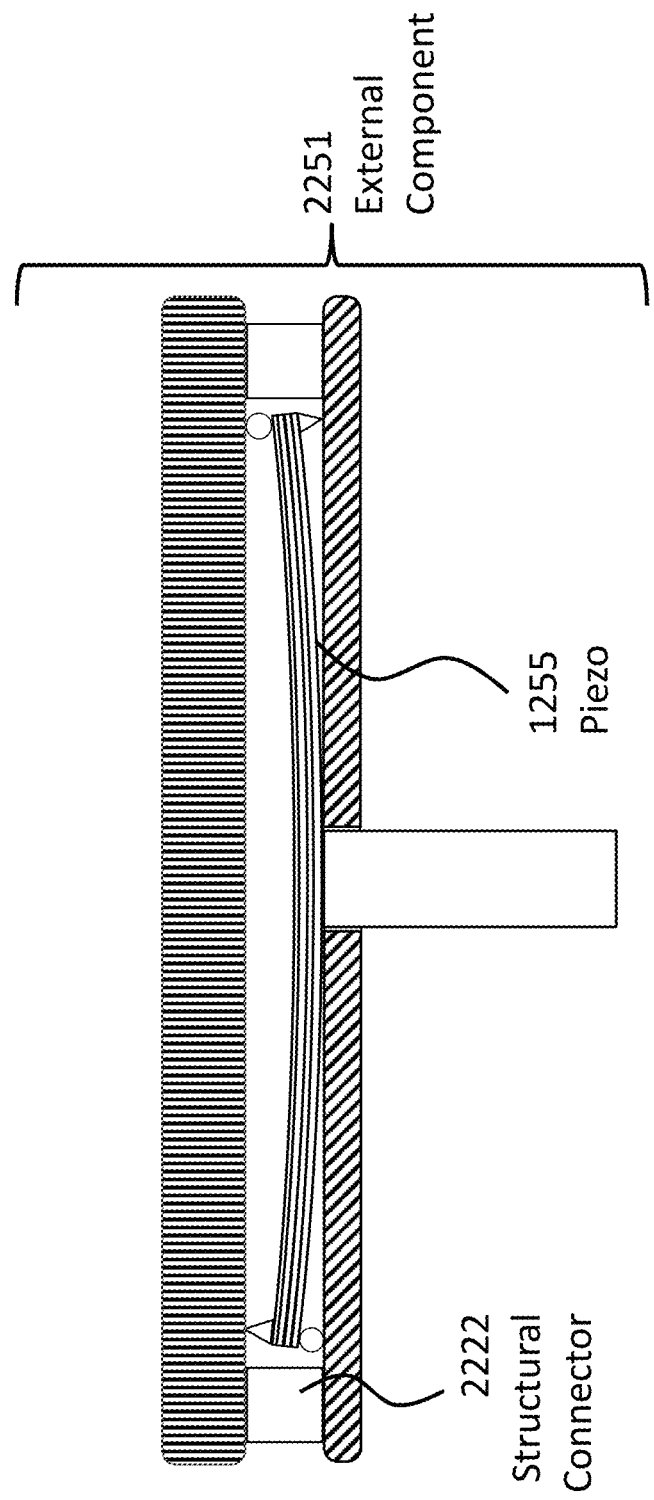

FIG. 22 presents an alternate embodiment of the embodiment of FIG. 21. Here, component 2251 is configured with rigid structural connectors 2222 that connect the lower mass to the upper mass. In this embodiment, connectors 2222 can be blocks of any material that can have utilitarian value that can rigidly connect the upper mass to the lower mass. That said, it is noted that in an alternative embodiment, connectors 2222 can flexibly connect or rotationally connected to masses, such that the two masses can move relative to one another and thus do not collectively establish a rigid body, but instead established to separate and independent rigid bodies that are coupled to one another in a nonrigid manner.

Figure 23:
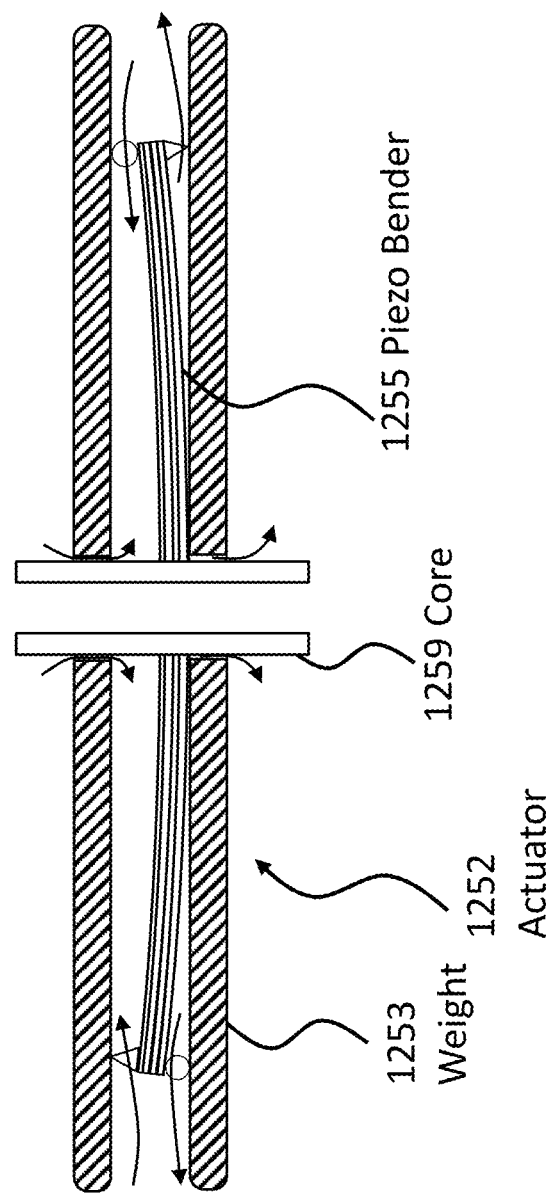
FIG. 23 presents an exemplary conceptual schematic demonstrating how gas damping works in some embodiments.

It is briefly noted that there are clearances between the core 1259 and the masses 1253. Briefly, as can be seen in the schematics, each of the masses have a hole through which the core 1259 extends. In an exemplary embodiment, the core and the masses are sized and dimensioned such that the masses never contact the core in any scenario other than one in which the component is broken. In an exemplary embodiment, the respective gaps between the cores and the masses are arranged so as to provide a gas damped system. In this regard, FIG. 23 depicts arrows representing gas flow from between the piezoelectric bender 1255 and the masses (or the counterweight apparatus) and vice versa. It is noted that in an alternate embodiment, there are seals or the like that prevents or otherwise limit gas flow through the gaps. That said, in some embodiments, the holes through the masses are sized and dimensioned such that the masses establish seals themselves with respect to the core 1259.

Also seen in the embodiment of FIG. 23 are arrows representing gas flow through the pin and roller connectors, although in other embodiments, the component is arranged such that there is little to no gas flow through those connectors.

In some embodiments, a valve or the like is present through one or both of the masses, and the flow of gas is primarily through that valve.

In some embodiments, the gas damping is established via movement of gas flow from in between the bender and the seismic mass and vice versa. In some other embodiments, there is little to no a relatively little to no gas movement, and gas damping occurs as a result of the compressibility of a given gas. Both types of embodiments can be utilized to dampen the movement of the bender, both with respect to normal operation of the bender to evoke a hearing percept, as well as in a scenario where the bender is subjected to a high G environment.

Figure 24:
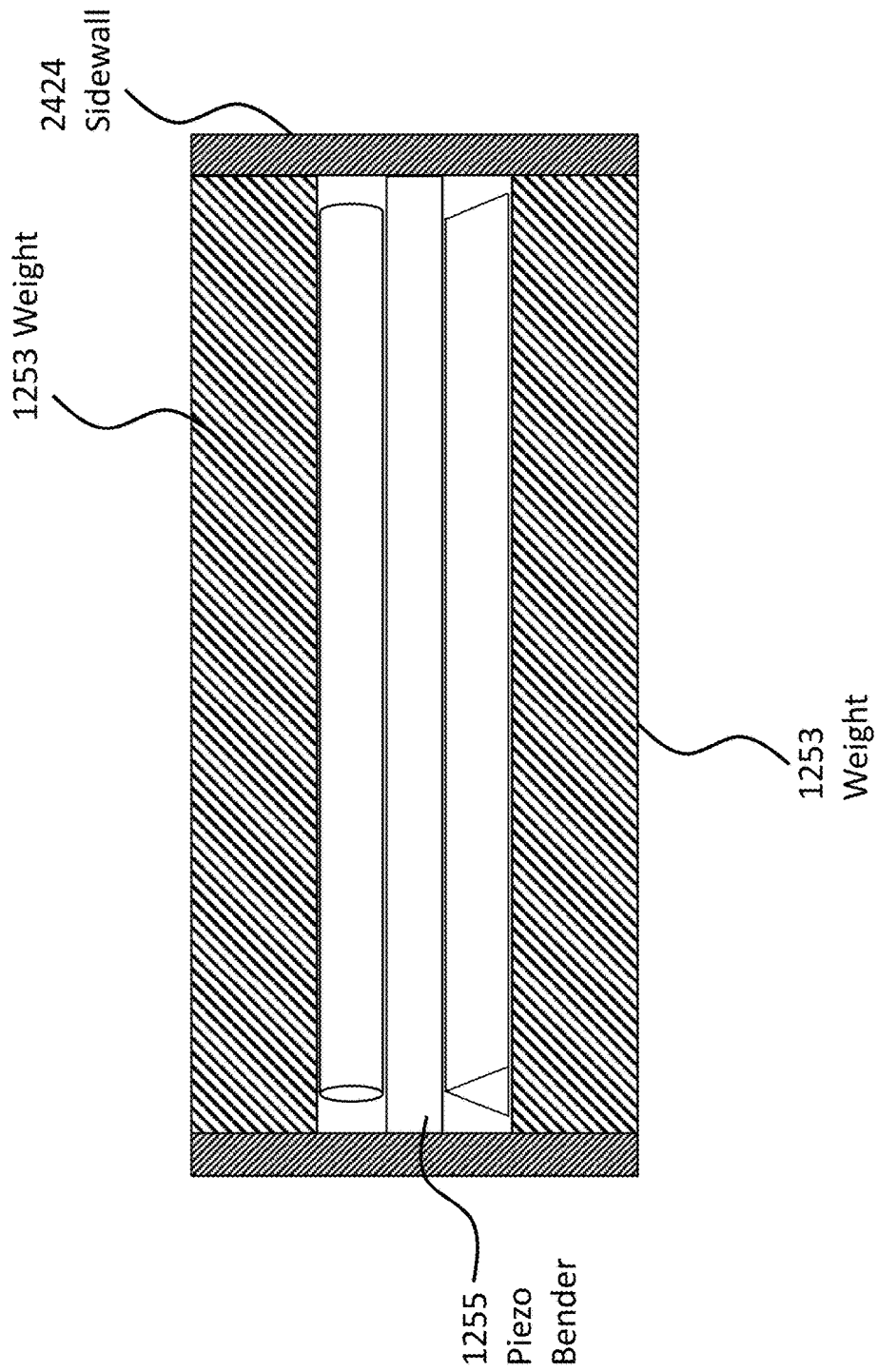
FIG. 24 is a cross-sectional view of the embodiment of FIG. 18.

FIG. 24 depicts the cross-section through FIG. 18 along with some exemplary componentry not shown in FIG. 18. Here, sidewalls 2424 extend from the top mass 1253 to the bottom mass 1253. The sidewalls form a skirt or a shroud that extends around the bender 1255. In an exemplary embodiment, the bender 1255 is in contact with the sidewalls so as to limit or otherwise substantially prevent the flow of gas from one side to the other. That said, in an exemplary embodiment, a seal is located between the bender and the sidewalls 2424 that prevents the flow of gas from one side to the other. Also, as with all of the dimensioning in at least some exemplary embodiments, the clearances between the two components are such that the effective flow of gas between the two components is minimal relative to the utilitarian value of preventing gas flow from one side to the other (e.g., damping). That is, in an exemplary embodiment, the components do not establish a seal per se, but the tolerancing and dimensioning is such that gas damping occurs because the amount of gas that can flow through the gaps is minimal with respect to the time frames that exist.

The embodiment of FIG. 24 also shows the pinned and the roller connectors. In an exemplary embodiment, the pinned and the roller connectors establish a barrier that prevents or otherwise limits the flow of gas from one side thereof to the other. That said, in some alternate embodiments, additional seals are utilized to prevent or otherwise limit the flow of gas from one side to the other. That said, it may not necessarily be needed to limit the flow of gas from one side to the other of the connectors. In some embodiments, all that may be necessary to achieve the gas damping is to prevent the flow of gas from one side of the bender to the other side of the bender around the tips of the bender. Thus, in an exemplary embodiment, seals can be located at the tips of the bender or inboard of the tips of the bender. The seals can be compressible. In an exemplary embodiment, the seals provide a modicum of damping as well, while in other embodiments, the seals provide minimal damping relative to the gas damping that occurs. In an exemplary embodiment, to the extent of the system is damped, at least 50, 55, 60, 65, 70, 75, 80, 85, 86, 87, 88, 89, 90, 91, 92, 93, 94, 95, 96, 97, 98, 99, or 100% or any value or range of values therebetween in 0.1% increments (e.g., 55.5, 77.7, 66.2 to 94.4%, etc.), is a result of gas damping.

Note also that in some exemplary embodiments, while not shown in the figures, the shroud or skirt 2424 extends about the tips of the bender as well.

Figure 25:
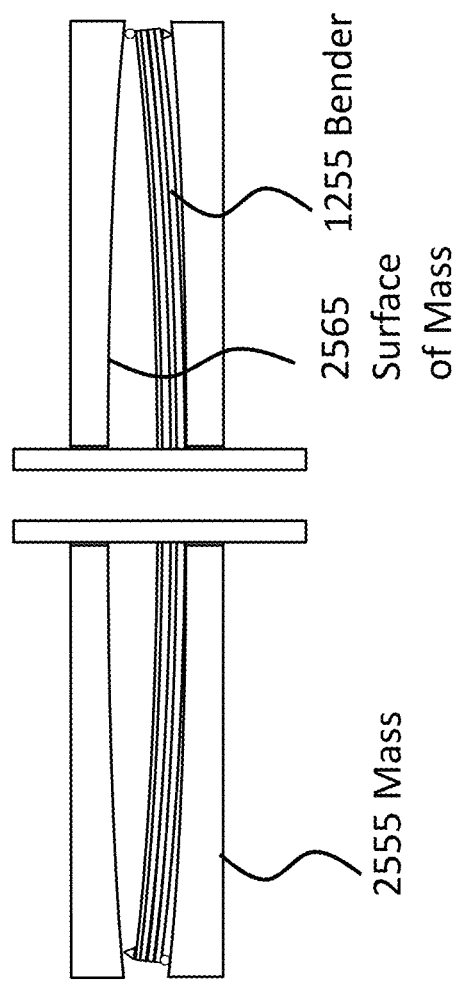
FIGS. 25-27 present alternate exemplary embodiments.

FIG. 25 presents an alternate embodiment of a seismic mass assembly, where the masses 2555 are curved with respect to the faces thereof that face the bender 1255. In this regard, the masses 2555 are concave structures relative to the bender 1255. Surface 2565 is an arcuate surface that extends as shown. This embodiment reduces the volume that is located between the bender and the respective portions of the seismic mass relative to that which would be the case with respect to a flat surface arrangement, as can be seen by comparing FIG. 25 to the embodiment of FIG. 23, although it is noted that the pin connector and the role a connector have been reduced in size in the embodiment of FIG. 25.

Figure 26:
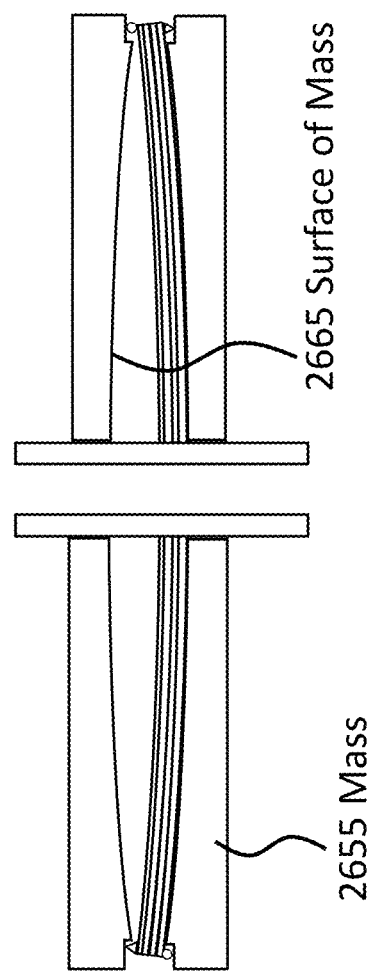

FIG. 26 presents an alternate embodiment where the surface 2665 is even more curved than that which is the case with respect to the embodiment of FIG. 25, such that the curved surfaces respectably parallel to respective surfaces of the bender when bent (either bent due to normal operation of the piezoelectric material or as a result of a high G environment or something in between). Here, counter masses 2655 have recessed areas for the pinned and roller connections, thus enabling the additional curvature of this embodiment. It is briefly noted that in this exemplary embodiment, it is possible for the surfaces 2665 to be configured to provide some additional shock absorbing feature. By way of example only and not by way of limitation, as will be demonstrated below, the surfaces can be established by components that are separate from the tungsten of the seismic masses. These components can be made out of soft plastic or even hard plastic, which will still be less hard than the tungsten mass. Note that in an alternative embodiment, even without the curved surfaces, and embodiment can exist where the portions of the tungsten mass proximate the central core are hogged out a bit, or otherwise include recesses extending in a radial direction away from the core, in which a softer material is located, so as to provide additional shock absorption or otherwise avoid hard material to put the material contact (or, more accurately, really hard material to brittle material contact).

As will be understood, these different curvatures relative to the embodiment of FIG. 23 result in different gas flow regimes than that which is the case of FIG. 23. In an exemplary embodiment, this can achieve different amounts of damping. This can achieve higher compression of the gas than that of FIG. 23, but also can reduce the amount of gas that is present in the given volumes relative to that of FIG.

23. One or both of these features can be adjusted by design to vary or otherwise achieve a desired damping.

Note also that in an exemplary embodiment of the embodiments of FIG. 25 in FIG. 26, the contact between the seismic mass and the bender is more evenly distributed/is distributed over a larger area. This can have additional utilitarian value with respect to shock-proofing. In an exemplary embodiment, upon the prevention of further bending of the bender, at least 10, 15, 20, 25, 30, 35, 40, 45, 50, 55, 60, 65, 70, 75, 80, 85, 86, 87, 88, 89, 90, 91, 92, 93, 94, 95, 96, 97, 98, 99, or 100% or any value or range of values therebetween in 0.1% increments (e.g., 55.5, 77.7, 66.2 to 94.4%, etc.) of a surface area of one side of the bender interacts with the stop (in this case, the seismic mass) in a high G environment.

Figure 27:
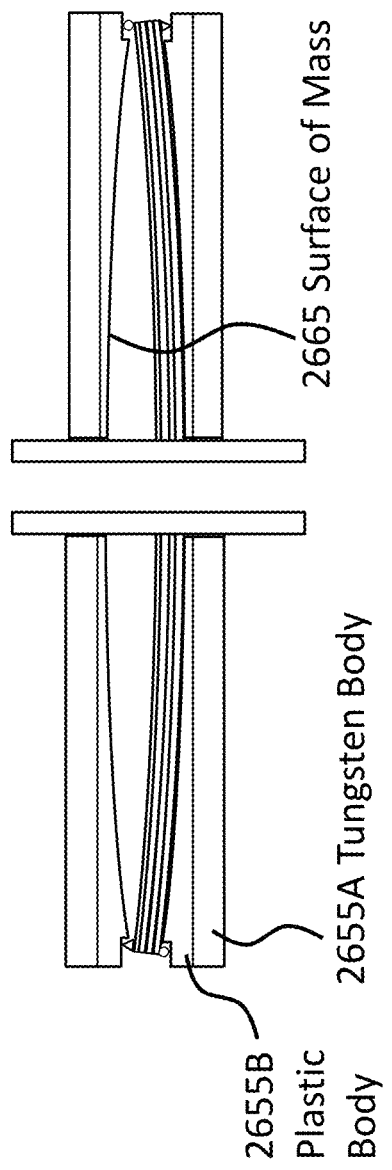

In exemplary embodiments, the masses of the seismic masses are tungsten plates having rectangular cross-sections. In an exemplary embodiment, the surfaces 2565 and 2665 are machined out of a tungsten body, and thus the upper counterweight and the lower counterweight are respectively monolithic components. That said, there can be utilitarian value with respect to utilizing tungsten plates and attaching thereto plastic or some other more easily machined or formed material that establishes the curved surfaces. In this regard, FIG. 27 depicts a composite seismic mass made up of a tungsten body 2655A that is in the form of a plate and a plastic body 2655B with a machined curved surface 2665 that faces the bender and is otherwise parallel to the bender when the bender bends during operation and/or during a high G environment or something in between.

Figure 28:
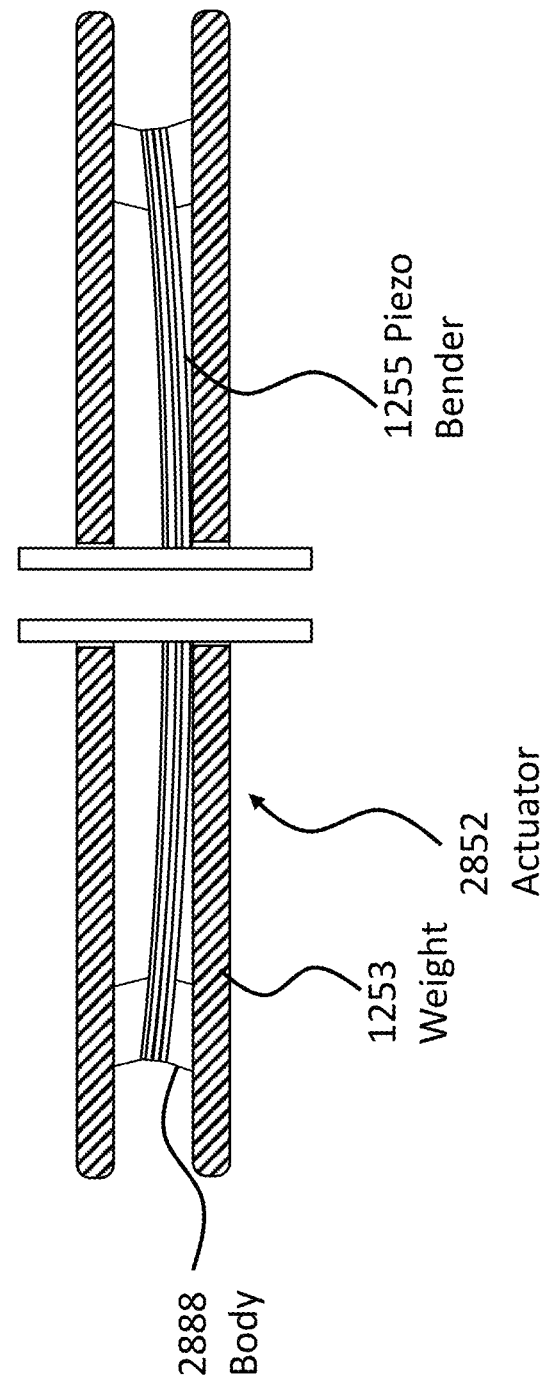
FIGS. 28 and 29 present alternate exemplary embodiments.

FIG. 28 depicts another exemplary embodiment of a transducer-seismic mass assembly 2855 that can have utilitarian value with respect to the embodiments herein. Here, a flexible and/or compressible material 2588 is provided as the connection between the bender 1255 and the counter masses 1253. In an exemplary embodiment, the material 2855 is a double-sided adhesive tape that adhesively adheres to the bender and the counter mass. The material 2855 shears as shown in the figures, albeit in an exaggerated form (it is noted that almost all if not all of the figures herein depict exaggerated movements and the like—as will be described below, the movements of the bender are relatively small). In an exemplary embodiment, the material 2855 is resistant to shear but still enables the system to be sufficiently decoupled so as to allow the bender to bend to evoke a utilitarian hearing percept. In an exemplary embodiment, the material 2855 is resistant to shear at a level that the shear resistance dampens the system. By selecting the type of material and/or the amount of material that is present, the damping of the system can be designed adjusted. It is also noted that the embodiment of FIG. 28 can be used in combination with the pinned and roller connections. In this regard, in an exemplary embodiment, the bodies 2888 need not necessarily be adhesively adhered to both the bender and the mass. The bodies 2888 simply provide shear resistance to movement between the two components, thus damping the system.

The arrangement of FIG. 28 can represent a seismic mass transducer where the seismic mass is coupled to the transducer by at least one compliant joint. In some embodiments, the seismic mass is coupled to the transducer by at least two or three or four or five or six or more compliant joint. Any arrangement of joints that are compliant can be utilized in some exemplary embodiments. Further, as can be seen, the exemplary compliant joint of FIG. 28 is configured to deform in shear when the transducer deflects.

Figure 29:
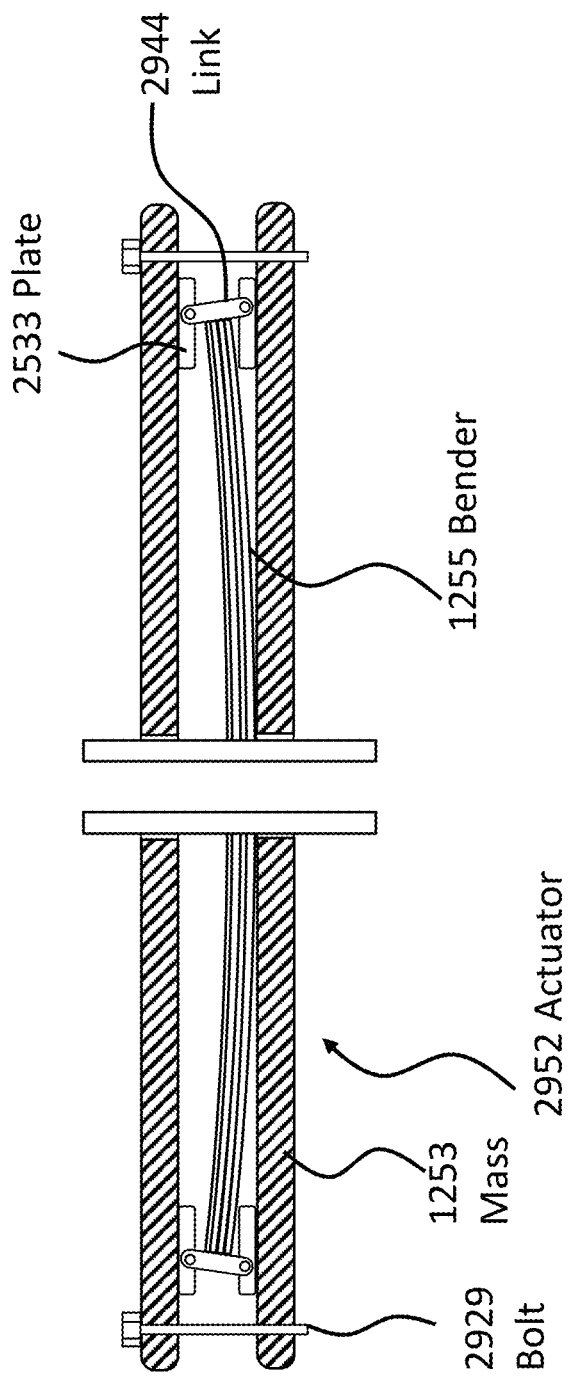

FIG. 29 presents an alternate exemplary embodiment of a component that utilizes shear to dampen the system. Here is shown a transducer-seismic mass assembly 2952, where the masses 1253 are adjustably located relative to one another these are the bolts 2929. In this exemplary embodiment, the bottom mass 1253 has respective threaded bores through which the respective bolts extend, and by screwing the bolts in one direction or the other, the distance between the two masses can be expanded and/or contracted. Positioned in between the two masses are shear plates 2533 which are configured to move in a sliding manner along the inside surfaces of the respective masses. The plates 2533 are held to the assembly via links 2944, which links are rigidly connected to the ends of the bender 1255, such as by adhesive or the like. The links 2944 are hingedly connected, via pins, to the shear plates 2533. During operation of the bone conduction device, the shear plates move against the inside surfaces of the masses. Depending on the amount of friction resistance between the plates and the masses, greater or less the damping that will result. By decreasing the distance between the two masses 1253, an increase to the resistance to movement of the plates relative to the masses will result, and vice versa. Thus, the damping of the system can be tuned during manufacturing. Further, in an exemplary embodiment, it is possible via an actuation system to adjust the clamping, so as to adjust the damping after manufacturing/during the life of the component.

Thus, in view of the above, an exemplary embodiment includes a component of a bone conduction device, comprising a housing and a piezoelectric bender located in the housing, wherein bending of the piezoelectric bender is damped via at least one of gas damping or shear damping. In an exemplary embodiment, bending is damped via gas damping, while in other embodiments, bending is damped via shear damping.

Further, the assembly of which the piezoelectric bender is a part is a transducer-seismic mass assembly in some embodiments, and the seismic mass of the seismic mass assembly includes a first portion, the first portion extending along a span of the bender from one side to the opposite side in the span direction and the first portion and the bender form a barrier to the movement of gas from an inside to an outside and vice versa of an extrapolated volume established by the first portion and the bender, thereby establishing the damping. In an exemplary embodiment, a shroud extends from the first part to lateral sides of the bender, thereby restricting flow of gas into and out of the extrapolated volume. Also, in an exemplary embodiment where the assembly of which the piezoelectric bender is a part is a transducer-seismic mass assembly, the transduce-seismic mass assembly establishes a vacuum chamber that damps movement of the bender.

Referring back to at least some of the exemplary embodiments that have detailed the rigid body/flexible body relationship between the seismic mass and the bender, in at least some exemplary embodiments where the assembly of which the piezoelectric bender is a part is a transducer-seismic mass assembly, the bender is configured such that at least one tip of the bender moves relative to a seismic mass of the assembly that is supported by the bender at a location at and/or proximate the tip. This is differentiated from the embodiment of FIG. 9 or FIG. 11.

In an exemplary embodiment, still with respect to an embodiment where the assembly of which the piezoelectric bender is a part is a transducer-seismic mass assembly, the seismic mass of the assembly is a free body relative to the bender. This again is distinct from the embodiments of FIGS. 9 and 11.

Further, in at least some exemplary embodiments, a face of the bender facing a face of the seismic mass of the assembly directly opposite the face of the bender moves relative to each other when the bender bends.

Figure 30:
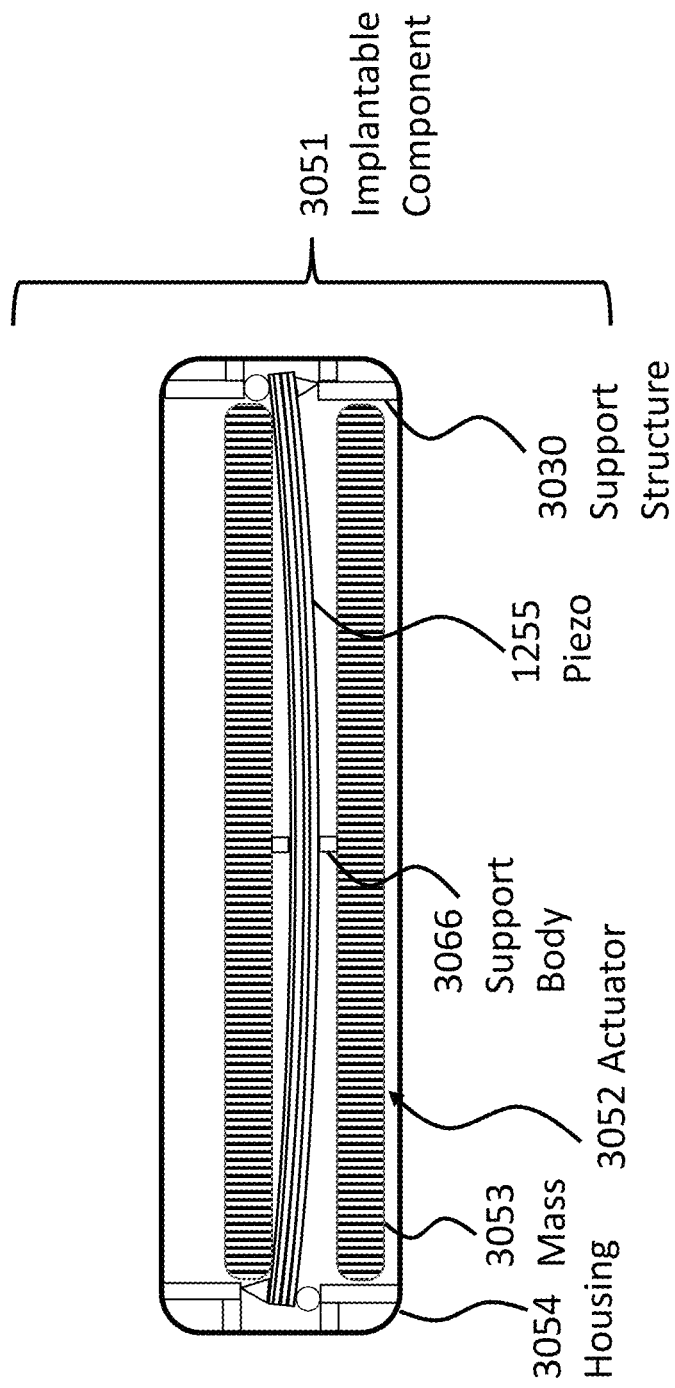
FIGS. 30, 31, and 32 present alternate exemplary embodiments with respect to how the bender is supported by the housing.

It is noted that while the embodiments detailed above have been directed towards embodiments where the bender is supported relative to the housing in the central location thereof, in some other embodiments, the bender is supported at the ends of the tips. In this regard, FIG. 30 presents an exemplary component 3050 one of a bone conduction device where transducer-seismic mass assembly 3052 includes bender 1255 that is pinned and roller connected to the housing 3054 via a support structure 3030. Here, the masses 3053 are supported by the bender 1255 at the center by support bodies 3066. In an exemplary embodiment, support bodies 3066 can correspond to disk structures that can be made out of a solid material and adhesively bonded to the bender and/or the masses 3053. In any event, as can be seen, a principle of operation here is still the bender coming into contact with the masses 3053 so as to prevent further bending of the bender. In this exemplary embodiment, instead of the convex face of the bent bender contacting the seismic mass assembly or otherwise functioning as the face that establishes the reaction force, it is the con cave face of the bent bender that contacts the seismic mass and functions as the face that establishes the reaction force. By controlling or otherwise design adjusting the span of the counterweights and/or the distance of the counterweights from the bender, the amount of the flexion can be design adjustedly controlled.

Figure 31:
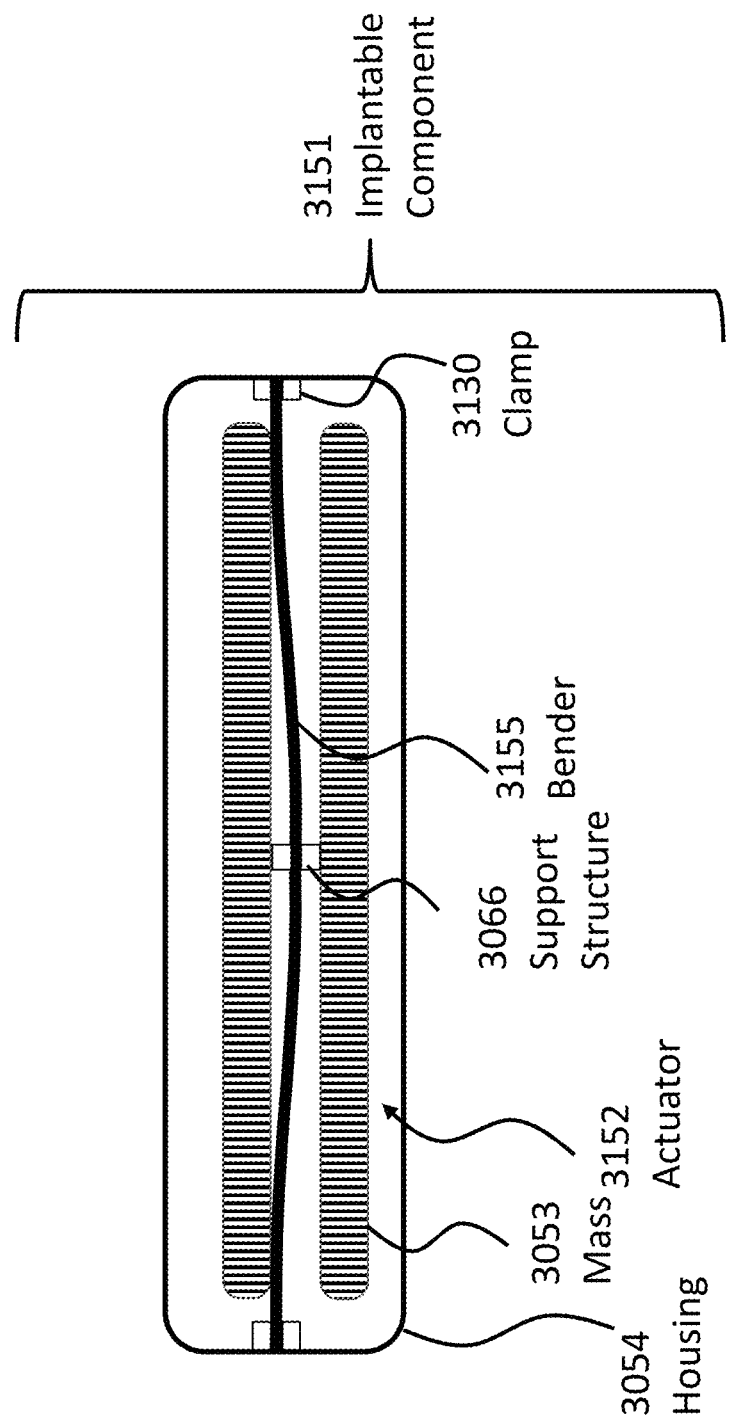

FIG. 31 presents another exemplary embodiment of a component 3151 of a bone conduction device. Here, the transducer-seismic mass assembly 3152 includes a bender 3155 that is in a fixed connection relative to the housing 3054 via clamps 3130, which compressively the clamp the bender 3155 so as to establish a fixed connection (as opposed to a pinned connection and/or a roller connection) to the housing. When the bender 3155 bends, maximum bending is controlled via contact of the bender with the masses, as seen. In this regard, the principle of operation with respect to shockproofing is analogous to that of the embodiment of FIG. 30 vis-à-vis the location of contact between the bender and the seismic mass.

Figure 32:
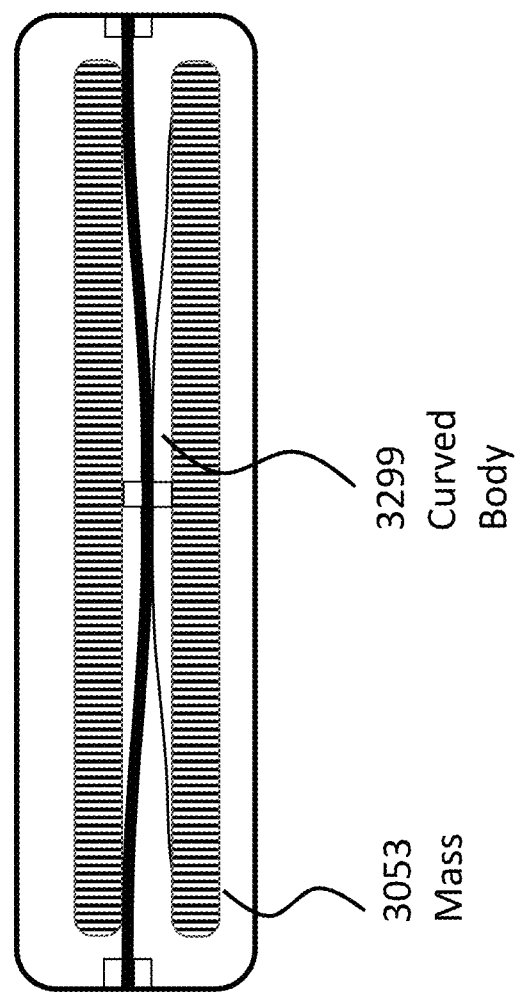

FIG. 32 presents a variation of the embodiment of FIG. 31, where a curved body 3299 has been respectably added to the masses 3053. In this exemplary embodiment, the curved body functions in a manner analogous to the curved surfaces detailed above that limit or otherwise reduce the volume between the seismic mass and the bender and/or otherwise spread out the surface area of contact between the seismic mass in the bender in a high G environment. Concomitant with the teachings detailed above, body 3299 is separate from the tungsten plate 3053, and it, in an exemplary embodiment, can be molded plastic. That said, in an alternate embodiment, element 3299 is monolithic with the seismic mass.

Figure 33:
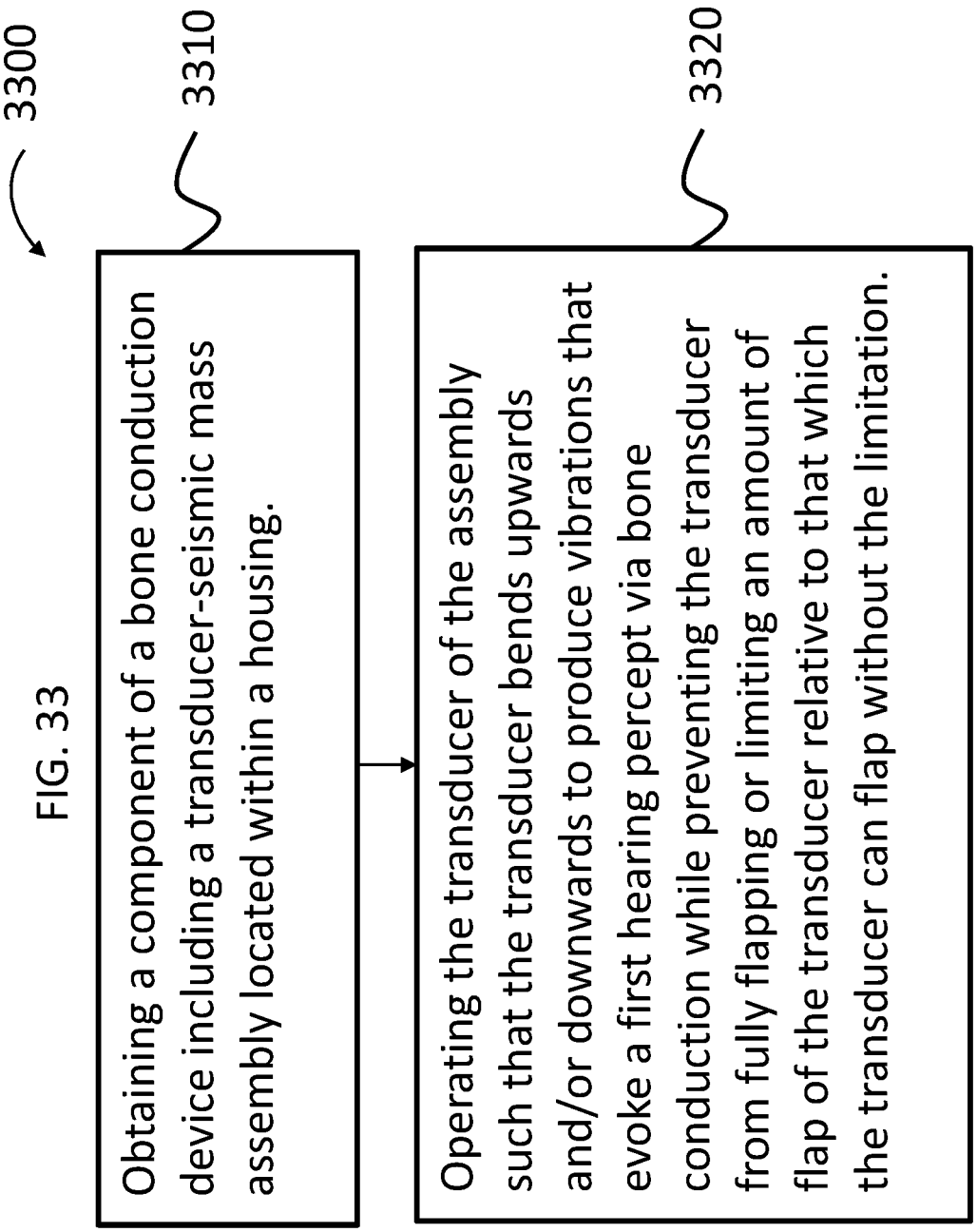
FIGS. 33 and 34 present exemplary flowcharts for exemplary algorithms.

FIG. 33 presents an exemplary flowchart for an exemplary method, method 3300, according to an exemplary embodiment. Method 3300 includes method action 3310, which includes obtaining a component of a transcutaneous bone conduction device including a transducer-seismic mass assembly located within a housing, and method action 3320, which includes operating the transducer such that the transducer bends upwards and/or downwards to produce vibrations that evoke a hearing percept via bone conduction. Method 2700 also includes method action 2730, which includes, subsequent to the action of operating the transducer, preventing the transducer from flapping. Method 2700 also includes method action 2740, which includes, operating the transducer of the assembly such that the transducer bends upwards and/or downwards to produce vibrations that evoke a first hearing percept via bone conduction while preventing the transducer from fully flapping or limiting an amount of flap of the transducer relative to that which the transducer can flap without the limitation. In an exemplary embodiment of this method, the seismic mass assembly is free of direct and/or indirect contact with the housing during normal operation other than via the transducer. By way of example only and not by way of limitation, such corresponds to the embodiment of FIG. 12 but not the embodiment of FIG. 11.

In an exemplary embodiment of this exemplary method, the component includes a permanently engaged anti-shock apparatus, wherein the anti-shock apparatus prevents or limits the amount of flapping, and the anti-shock apparatus is completely independent of the housing. This is compared to, for example, the embodiment of FIG. 9, where the anti-shock apparatus depends on the housing.

Figure 34:
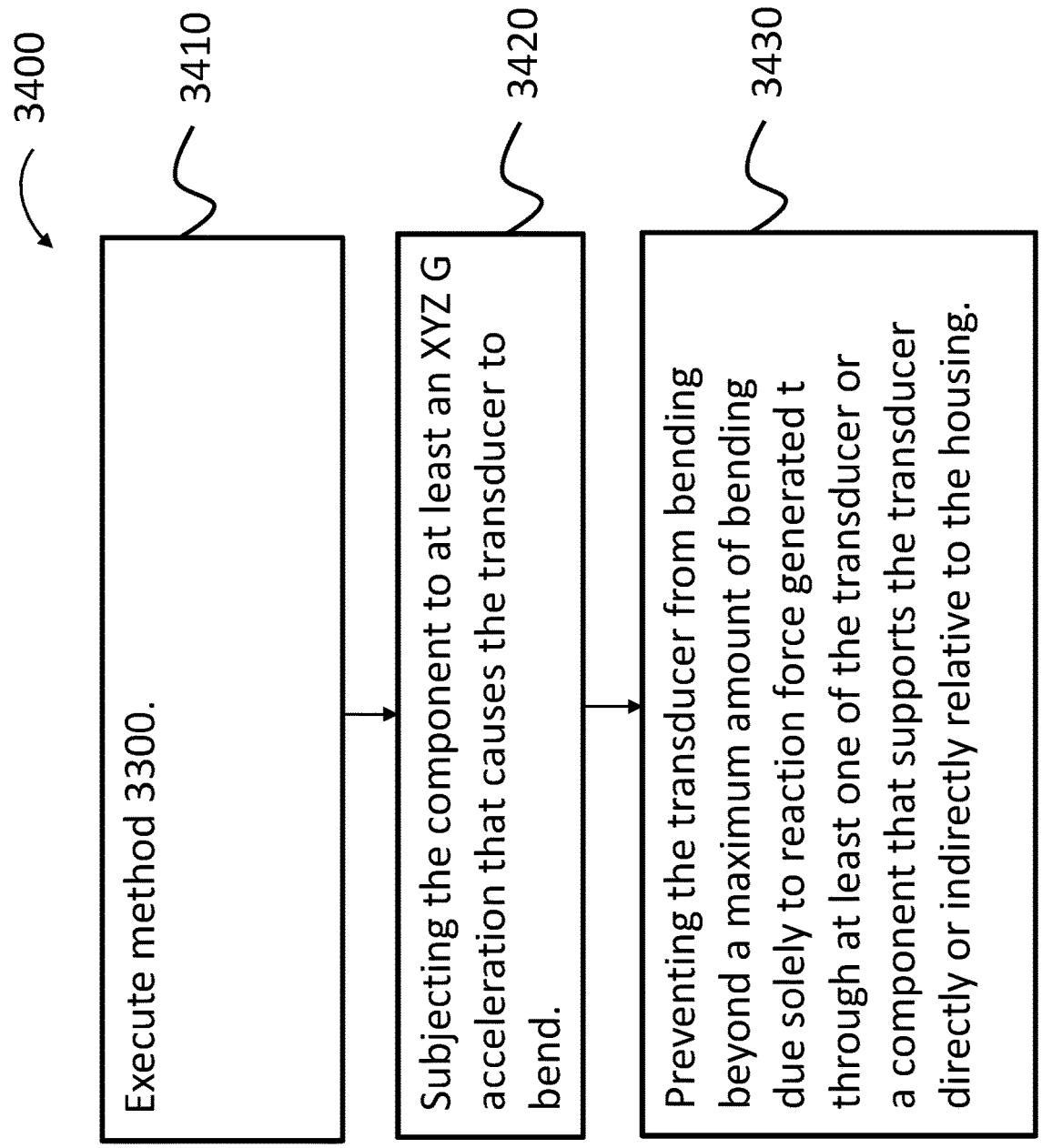

FIG. 34 presents another flowchart for another exemplary algorithm for an exemplary method, method 3400. Method 3400 includes method action 3410, which includes executing method 3300. Method 3400 also includes method action 3420, which includes subjecting the component to at least XYZ G acceleration that causes the transducer to bend or flex. In an exemplary embodiment, XYZ is 10, 15, 20, 25, 30, 35, 40, 45, 50, 60, 70, 80, 90, or 100.

Method 3400 also includes method action 3430, which includes preventing the transducer from flexing or bending beyond a maximum amount of flexing or bending due solely to reaction force generated through at least one of the transducer or a component that supports the transducer (e.g., the core via the stops) directly or indirectly relative to the housing.

Further, the transducer is damped via at least one of gas or shear damping during operation of the transducer during operation of the transducer. Also, in some embodiments, the transducer is damped primarily via one of gas or shear damping during operation of the transducer during operation of the transducer.

In another exemplary method, there a method that includes executing method 3300, and further comprising subjecting the component to at least an XYZ G acceleration that causes the transducer to flex or bend. The method further includes preventing the transducer from flexing or bending beyond a maximum amount of flexing or bending that would otherwise take place in the absence of the action of preventing without changing a state of the component from that which existed during operation of the transducer. In this regard, some anti-shock apparatus is used in bone conduction devices are of a configuration that alternately places the device into shock-proofing and out of shock-proofing, thus changing a state of the component. Moreover, in the embodiment of FIG. 9, the movement of the transducer-seismic mass assembly relative to the housing in its entirety also changes a state of the component. Here, the state of the component remains the same.

In another exemplary method, there a method that includes executing method 3300, and further comprising subjecting the component to at least an XYZ G acceleration that causes the transducer to flex or bend, and preventing damage to the transducer from shock due to a combination of gas to solid contact and solid to solid contact. In this regard, in this exemplary embodiment, the gas not only damps the transducer, but also serves as shock prevention. In another exemplary method, there a method that includes executing method 3300, wherein, during operation of the transducer, movement of the transducer seismic mass assembly is damped while being in contact with the housing only through a support apparatus of the assembly through which vibrations are transferred to evoke the hearing percept. This is different than the embodiment of FIG. 11, where the transducer-seismic mass assembly is in contact with the housing via 316A, etc. This is also different than the embodiment of FIG. 9, insofar as vibrations are not transferred through the springs to evoke a hearing percept.

Still further, in an exemplary embodiment of the execution of method 3300, during operation of the transducer, a mass of the seismic-mass assembly moves relative to the transducer. Again, this is differentiated from the embodiment of FIG. 9. Where the mass (actually, masses) move in a one-to-one relationship with the movements of the transducer.

Figure 35:
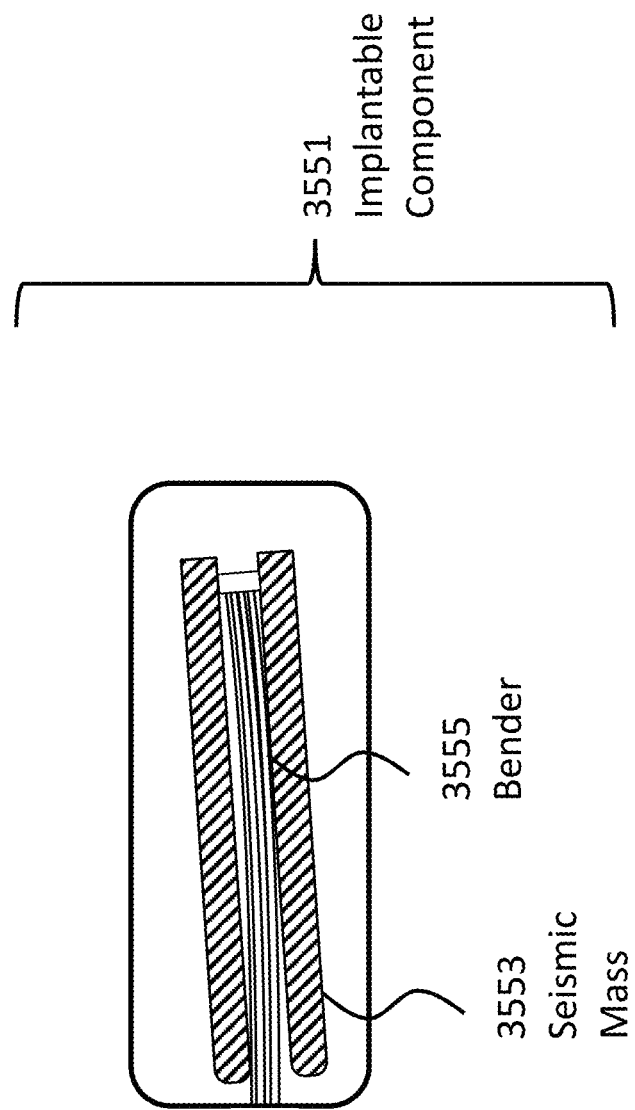
FIG. 35 presents another alternative exemplary embodiment.

It is also noted that at least some exemplary embodiments can include a cantilevered bender, where the bender is fixed to the housing in a cantilever manner and one end, and the mass is located at the other end. In an exemplary embodiment, the counterweight can be arranged so as to obtain the principles according to the embodiment of FIG. 12 the variations thereof. For example, the counterweight can limit the amount of bending that would result. FIG. 35 presents an exemplary embodiment of such, where bender 3555 is cantilever fixed to the sidewall the housing and seismic mass 3553 extends about both sides of the bender and is fixed at the tip of the bender, such that upon bending of the bender by a certain amount, the seismic mass prevents further bending.

It is briefly noted that in the embodiment of FIG. 35, there can be utilitarian value with respect to connecting the housing in which the components shown are located to the bone at a location offset from the central axis of the housing. In this regard, the forces resulting from actuation will be transmitted through the left side housing wall. There can be thus utilitarian value to connecting the housing to the bone at a location proximate thereto. In an exemplary embodiment, a flange the like can extend to the left, which flange can be attached to bone fixture or otherwise screwed to bone. A flange can be located on the right side as well to provide symmetry. Again, in at least some exemplary embodiments, there is no bone fixture or separate connecting component that connects to the bone. Accordingly, the embodiment of FIG. 35 could be a candidate for placement on to bone surface and/or within a recess of the bone without a bone fixture.

As noted above, in some exemplary embodiments, the bender is prestressed or otherwise pre-bent in the at rest or otherwise an energized state. In an exemplary embodiment, such an arrangement can reduce or otherwise eliminate or otherwise prevent the loss and/or the reduction of shear during actuation.

In view of the above, it can be seen that in an exemplary embodiment, there is a single mass-transducer arrangement (e.g., where the upper and lower mass are rigidly fixed to one another and act as a rigid body). This is distinguished from, for example, the multi-mass embodiments of FIGS. 9 and 11 detailed above. Moreover, it can be seen that in at least some exemplary embodiments, this feature includes integrated air damping and/or protection to against over deflection. Indeed, the one creates the other, and vice versa in some embodiments.

In some embodiments, the maximum amount of movement that the transducer is permitted to move (i.e., at the tips) is JKL micrometers in any one direction from an at-rest location. In an exemplary embodiment, JKL is 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, or any value or range of values therebetween in about 0.1 increments.

In an exemplary embodiment, the distance from the center of the piezoelectric transducer to the outermost edge of the piezoelectric material is about 2, 2.1, 2.2, 2.3, 2.4, 2.5, 2.6, 2.7, 2.8, 2.9, 3.0. 3.1, 3.2, 3.3, 3.4, 3.5, 3.6, 3.7, 3.8, 3.9, 4.0, 4.1, 4.2, 4.3, 4.4, 4.5, 4.6 4.7, 4.8, 4.9. 5.0, 5.1, 5.2, 5.3, 5.4, 5.5, 5.6, 5.7, 5.8, 5.9, or 6 mm or any value or range of values therebetween in about 0.01 mm increments.

In an exemplary embodiment, the distance from the piezoelectric transducer to the seismic mass is a distance that is about equal to the average size of a human red blood cell. In an exemplary embodiment, the distance is less than 1, 2, 3, 4, 5, 6 , 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 times greater than that that or less than 1, 2, 3, 4, 5, 6 , 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40 times less than that or any value or range of values therebetween in 0.1 increments.

It is also noted that in an exemplary embodiment, the relative dimensions of the components that establish air damping remain constant from the time that the various components are first placed together to the first actuation of the seismic mass transducer to evoke a hearing percept. In this regard, there can be utilitarian value with respect to utilizing the teachings detailed herein in that there is no shrinkage or expansion or the like with respect to the components that establish the air damping. Corollary to this is that in at least some exemplary embodiments, the air damping that is established is an air damping that is precisely designed into the system. This as opposed to, for example, utilizing or otherwise having air damping that results in components that have distances that could vary from one manufacturer to the other or otherwise that have distances that are not accurately reproducible from one manufacturer to the other. In an exemplary embodiment, the componentry that establishes the air damping is such that for 5 or 10 or 15 or 20 or 30 or 40 or 50 or 60 or 70 or 80 or 90 or 100 or more devices, the average distances between the components that establish air damping of one component is within 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39 or 40 or 50 or 60 or 70 or 80 percent of the average distances for all the other components, etc.

In an exemplary embodiment, the transducer is configured such that, during operation to evoke a hearing percept, when the component is subjected to a one G environment, the transducer bends upwards a maximum of a first value and downward a maximum of a second value, wherein the direction of movement upward and downward is parallel to the direction of gravity of the one G environment, and when the transducer is prevented from flapping, the transducer cannot move upward more than the first value and/or downward more than the second value.

Referring back to FIG. 12, in an exemplary embodiment, with respect to the at rest position of the actuator, a maximum distance from one face of the bender to an opposite face of the seismic mass D1 is 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 55, 60, 65, 70, 75, 80, 90, or 100 micrometers, or any value or range of values therebetween in about 0.1 increments. In an exemplary embodiment, the aforementioned values are a mean, median and/or a mode maximum distance, embodiments where the face of the seismic mass is curved. In an exemplary embodiment, the smaller the distance between the two faces, the more utilitarian or otherwise meaningful the gas damping.

While embodiments have focused on pinned and roller connections between the bender in the seismic mass, again, as noted, a fixed arrangement can be utilized in some other embodiments. The fixed arrangements will, in some embodiments, impart stiffness on to the bender, which could potentially dampen the system. In some embodiments, such can be utilitarian. Moreover, with respect to the roller connections, these too can be arranged such that shear damping results. In an exemplary embodiment where rollers are indeed used, the rollers can have tacky surfaces and/or the surfaces that are adjacent the rollers are tacky, thus providing resistance to the rolling, and thus damping the system. Again, as noted above, the damping can be adjusted (design adjusted—that is, designed to be different during design) by varying the surface of contact/slide contact. In an exemplary embodiment, the larger the surface the greater the damping.

It is briefly noted that in a general sense, all of the embodiments detailed herein have some form of gas damping. For example, the embodiment of FIG. 11 could be argued to have gas damping because there is a gas located in the housing. However, the teachings detailed herein with respect to gas damping refer to effective gas damping. In this regard, the gas damping is something that exists beyond that which simply exist by moving a body through a gas.

With respect to the teachings detailed above that utilize double-sided tape, an exemplary embodiment can utilize tape produced by the 3M™ company. In an exemplary embodiment, the tape has vibration damping properties. Indeed, in an exemplary embodiment, "Vibration Damping Tape" is what is utilized as the interface between the bender and the seismic mass. It is noted that any arrangement that will enable connection between the tender and the seismic mass can be utilized that will enable the teachings detailed herein. In an exemplary embodiment, glue could be used.

In an exemplary embodiment, the resonant frequency of the arrangement according to the embodiment of FIG. 12 or the variations thereof is lower than that which results according to the embodiment of FIG. 11, all other things being equal. That is, for the same size piezoelectric bender, and the same weight of seismic mass, in the same size housing (height, length, width), for the same type of connection), the resonant frequency is at least 5, 10, 15, 20, 25, 30, 35, 40, 45, 50, 55, 60, 65, 70, 75, or 80 percent lower than that which would be the case for an embodiment according to FIG. 11.

It is also noted that at least some exemplary embodiments can include a cantilevered bender, where the bender is fixed to the housing in a cantilever manner and one end, and the mass is located at the other end. In an exemplary embodiment, the counterweight can be arranged so as to obtain the principles according to the embodiment of FIG. 12 the variations thereof. For example, the counterweight can limit the amount of bending that would result.

Briefly, it is noted that in some embodiments, when exposed to a 10, 15, or 20 G acceleration and/or deceleration, without the movement limitation devices disclosed herein (e.g., simulated mass and moment arrangement), the resulting flap and/or bending moves the piezoelectric transducer at least 4, 5, 6, 7, 8, 9, 10, 11, 12, 13, 14, 15, 20, 25, 30, 35, 40, 45, or 50 times the amount that occurs during normal operation in response to a pure sine wave at 1000 Hz at 80 dB (as measured at the microphone of the external component when used therewith).

Briefly, it is noted that in some embodiments, when exposed to a 10, 15, or 20 G acceleration and/or deceleration, with the movement limitation devices disclosed herein, the resulting flap and/or bending moves the piezoelectric transducer no more than 1.1, 1.2, 1.3, 1.4, 1.5, 1.6, 1.7, 1.8. 1.9, 2.0, 2.1, 2.2, 2.3, 2.4, 2.5, 2.6. 2.7. 2.8, 2.9, 3. 3.5, 4, 5, 6, 7, 8, 9, 10, 11, 12, 13, 14, 15, or 20 times or any value or range of values therebetween in 0.01 increments, the amount that occurs during normal operation in response to a pure sine wave at 1000 Hz at 80 dB (as measured at the microphone of the external component when used therewith).

In an exemplary embodiment, there is a component of a bone conduction device, comprising a housing and a piezoelectric bender located in the housing, wherein the component is configured to limit bending of the piezoelectric bender relative to that which would otherwise be the case in the absence of the limits via application of a stopping force at a centralized location of an assembly of which the bender is a part.

In an exemplary embodiment, there is the component as described above, wherein the piezoelectric bender is fixed relative to the housing with respect to movement in all directions at a central location thereof. In an exemplary embodiment, there is the component as described above, wherein the assembly of which the piezoelectric bender is a part is a transducer-seismic mass assembly, wherein the component is configured such that the transducer-seismic mass assembly is at all times free to move in an operational manner.

In an exemplary embodiment, there is the component as described above, wherein the bending of the piezoelectric bender is limited by the same amount in the complete absence of the housing. In an exemplary embodiment, there is the component as described above, wherein the assembly of which the piezoelectric bender is a part is a transducer-seismic mass assembly, wherein the stopping force is applied by a structure and/or a portion of a structure that is totally within the transducer-seismic mass assembly. In an exemplary embodiment, there is the component as described above, wherein the assembly of which the piezoelectric bender is a part is a transducer-seismic mass assembly, wherein a seismic mass of the seismic mass assembly envelops the bender.

In an exemplary embodiment, there is the component as described above, wherein the assembly of which the piezoelectric bender is a part is a transducer-seismic mass assembly and the seismic mass of the seismic mass assembly includes a first portion and a second portion, the first portion and the second portion extending along a span of the bender from one side to the opposite side in the span direction, the first portion being on one side of the bender and the second portion being on the opposite side in the bend direction, and the first portion establishes a rigid body and the second portion establishes a rigid body. In an exemplary embodiment, there is the component as described above, wherein the assembly of which the piezoelectric bender is a part is a transducer-seismic mass assembly, the seismic mass of the seismic mass assembly includes a first portion which moves when the bender bends, and the component is configured such that the first portion contacts the bender upon a sufficient amount of bending, thereby shock-proofing the bender. In an exemplary embodiment, there is the component as described above, wherein the assembly of which the piezoelectric bender is a part is a transducer-seismic mass assembly, the seismic mass of the seismic mass assembly includes a first portion which moves when the bender bends and the component is configured such that the first portion contacts a surface that is located on or between the bender and the first portion upon a sufficient amount of bending, thereby shock-proofing the bender. In an exemplary embodiment, there is the component as described above, wherein the assembly of which the piezoelectric bender is a part is a transducer-seismic mass assembly, the seismic mass of the seismic mass assembly includes a first portion which moves when the bender bends, and the component is configured such that the first portion contacts a component located between the bender and the first portion.

It is noted that any disclosure of a device and/or system herein corresponds to a disclosure of a method of utilizing such device and/or system. It is further noted that any disclosure of a device and/or system herein corresponds to a disclosure of a method of manufacturing such device and/or system. It is further noted that any disclosure of a method action detailed herein corresponds to a disclosure of a device and/or system for executing that method action/a device and/or system having such functionality corresponding to the method action. It is also noted that any disclosure of a functionality of a device herein corresponds to a method including a method action corresponding to such functionality. Also, any disclosure of any manufacturing methods detailed herein corresponds to a disclosure of a device and/or system resulting from such manufacturing methods and/or a disclosure of a method of utilizing the resulting device and/or system.

Unless otherwise specified or otherwise not enabled by the art, any one or more teachings detailed herein with respect to one embodiment can be combined with one or more teachings of any other teaching detailed herein with respect to other embodiments. Also, unless otherwise specified or otherwise not enabled, any one or more teachings detailed herein can be excluded from combination with one or more other teachings, in some embodiments.

While various embodiments have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments but should be defined only in accordance with the following claims and their equivalents.

What is claimed is:

1. A component of a bone conduction device, comprising:
a housing; and
a piezo-seismic mass assembly, wherein
the component is configured to enable permanent shock-proofing of a piezo transducer of the piezo-seismic mass assembly beyond that which results from damping while at least a portion of the piezo-seismic mass assembly is fixed relative to the housing.

2. The component of claim 1, wherein:
the transducer has a peripheral edge that extends about the periphery of the transducer; and
the transducer is configured to deflect about a location inboard of the peripheral edge to cause transduction.

3. The component of claim 1, wherein:
the transducer has a peripheral edge that extends about the periphery of the transducer; and
a seismic mass of the piezo-seismic mass assembly is configured to contact the transducer at a location inboard of a peripheral edge to prevent over-deflection at a location on the peripheral edge.

4. The component of claim 1, wherein:
the transducer has a peripheral edge that extends about the periphery of the transducer; and
a seismic mass of the piezo-seismic mass assembly is coupled to the transducer only at the peripheral edge.

5. The component of claim 4, wherein:
the peripheral edge of the transducer is configured to move inwardly relative to the seismic mass when the transducer deflects.

6. The component of claim 1, wherein:
the permanently shock-proofing exists while a vibratory path extending from the piezo- seismic mass assembly to the housing remains in place when experiencing a G force that moves the assembly a maximum amount.

7. The component of claim 1, wherein:
the piezo-seismic mass assembly includes a counterweight; and
the permanently shock-proofing exists even though the component is configured to prevent the assembly or any part carried by the assembly from striking the housing or any other component directly supported by the housing upon subjecting the housing to a G force that would otherwise break the assembly in the absence of the shock-proofing.

8. The component of claim 1, wherein:
the piezo-seismic mass assembly includes a piezoelectric bender and one or more counterweights supported by the piezoelectric bender;
the component is configured to apply an electrical current to the piezoelectric bender to cause the piezoelectric bender to bend in a vibratory manner, thereby moving the one or more counterweights towards and away from a surface of the housing in a vibratory manner;
the piezoelectric bender is operationally permanently fixedly supported relative to the housing; and
the component is configured such that vibrations from the piezoelectric bender travel therefrom to the housing to evoke a hearing percept.

9. The component of claim 1, wherein:
the piezo-seismic mass assembly includes a piezoelectric bender and one or more counterweights supported by the piezoelectric bender;
the component is configured such that the one or more counterweights effectively do not rotate within the housing during operational use of the assembly to evoke a hearing percept.

10. The component of claim 1, wherein:
the piezo-seismic mass assembly includes a piezoelectric bender and one or more counterweights supported by the piezoelectric bender;
the component is configured such that the one or more counterweights rotate within the housing during operational use of the assembly to evoke a hearing percept and the rotation is not counterbalanced by opposite rotation of another counterweight.

11. The component of claim 1, wherein:
the component is configured such that the vibratory path extending from the assembly to the housing remains in place until the component is broken.

12. A component of a bone conduction device, comprising:
a housing; and
a piezoelectric bender located in the housing, wherein bending of the piezoelectric bender is damped, the assembly of which the piezoelectric bender is a part is a transducer-seismic mass assembly, and
the seismic mass of the assembly is a free body relative to the bender.

13. The component of claim 12, wherein:
the bending of the piezoelectric bender is damped via gas damping.

14. The component of claim 12, wherein:
the seismic mass of the seismic mass assembly includes a first portion, the first portion extending along a span of the bender from one side to the opposite side in the span direction; and
the first portion and the bender form a barrier to the movement of gas from an inside to an outside and vice versa of an extrapolated volume established by the first portion and the bender, thereby establishing the damping.

15. The component of claim 12, wherein:
the transduce-seismic mass assembly establishes a vacuum chamber that damps movement of the bender.

16. The component of claim 14, wherein:
a shroud extends from the first portion to lateral sides of the bender, thereby restricting flow of gas into and out of the extrapolated volume.

17. The component of claim 13, wherein:
the bender forms part of a barrier to movement of gas from an inside to an outside and vice versa of an extrapolated volume established in part by the bender, thereby establishing the damping.

18. The component of claim 12, wherein:
bending of the piezoelectric bender is damped via at least one of gas damping or shear damping.

19. A component of a bone conduction device, comprising:
a housing; and
a piezoelectric bender located in the housing, wherein
the bending of the piezoelectric bender is damped via shear damping,
the component includes a shearable material, which shearable material provides the shear damping, and
at least one of:
(i) the shearable material is interposed between the piezoelectric bender and another portion of the component, wherein the bender moves relative to the another portion of the component; or
(ii) the assembly of which the piezoelectric bender is a part is a transducer-seismic mass assembly; and
the shearable material is interposed between the bender and a seismic mass of the seismic mass assembly.

20. The component of claim 19, wherein:
the shearable material is interposed between the piezoelectric bender and the another portion of the component, wherein the bender moves relative to the another portion of the component; and
the shearable material provides the shear damping.

21. The component of claim 19, wherein:
the assembly of which the piezoelectric bender is a part is the transducer-seismic mass assembly;
the shearable material is interposed between the bender and the seismic mass of the seismic mass assembly; and
the shearable material provides the shear damping.

22. The component of claim 19, wherein:
the assembly of which the piezoelectric bender is a part is the transducer-seismic mass assembly; and
the seismic mass of the assembly is a free body relative to the bender.

23. A component of a bone conduction device, comprising:
a housing; and
a piezoelectric bender located in the housing, wherein
bending of the piezoelectric bender is damped, wherein
the assembly of which the piezoelectric bender is a part is a transducer-seismic mass assembly, and
at least one of:
a face of the bender facing a face of the seismic mass of the assembly directly opposite the face of the bender moves relative to each other when the bender bends; or
the bender is configured such that at least one tip of the bender moves relative to a seismic mass of the assembly that is supported by the bender at a location at and/or proximate the tip.

24. The component of claim 23, wherein:
the bender is configured such that at least one tip of the bender moves relative to the seismic mass of the assembly that is supported by the bender at the location at and/or proximate the tip.

25. The component of claim 23, wherein:
the face of the bender facing the face of the seismic mass of the assembly directly opposite the face of the bender moves relative to each other when the bender bends.

26. The component of claim 25, wherein:
bending of the piezoelectric bender is damped via at least one of gas damping or shear damping.

27. The component of claim 24, wherein:
bending of the piezoelectric bender is damped via at least one of gas damping or shear damping.

* * * * *